United States Patent
Kim et al.

(10) Patent No.: US 11,552,136 B2
(45) Date of Patent: Jan. 10, 2023

(54) ELECTRONIC APPARATUS

(71) Applicant: Samsung Display Co., Ltd., Yongin-si (KR)

(72) Inventors: Il-Joo Kim, Hwaseong-si (KR); Wonkyu Kwak, Seongnam-si (KR); Jinsuk Lee, Yongin-si (KR); Chung Yi, Seongnam-si (KR); Sungho Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/844,847

(22) Filed: Apr. 9, 2020

(65) Prior Publication Data

US 2020/0328257 A1  Oct. 15, 2020

(30) Foreign Application Priority Data

Apr. 15, 2019 (KR) .................. 10-2019-0043495

(51) Int. Cl.
*H01L 27/32* (2006.01)
*H01L 51/50* (2006.01)
*G06F 3/041* (2006.01)

(52) U.S. Cl.
CPC .......... *H01L 27/323* (2013.01); *H01L 27/326* (2013.01); *H01L 27/3232* (2013.01); (Continued)

(58) Field of Classification Search
CPC ............... H01L 27/323; H01L 27/3232; H01L 27/3248; H01L 51/5096; H01L 51/5056; (Continued)

(56) References Cited

U.S. PATENT DOCUMENTS 8,467,177 B2  6/2013 Mathew et al.
9,582,087 B2  2/2017 Kang
(Continued)

FOREIGN PATENT DOCUMENTS

JP   2010-207605 A   9/2010
JP      6018276 B2   11/2016
(Continued)

OTHER PUBLICATIONS

U.S. Office Action dated Dec. 22, 2021, issued in U.S. Appl. No. 16/953,866 (15 pages).
(Continued)

*Primary Examiner* — Bitew A Dinke
(74) *Attorney, Agent, or Firm* — Lewis Roca Rothgerber Christie LLP

(57) ABSTRACT

An electronic apparatus includes: an electronic panel comprising a display unit comprising a plurality of pixels and a sensing unit comprising a plurality of sensing electrodes; and an electronic module overlapping with the electronic panel when viewed in a plan view, the sensing unit comprising: a base substrate comprising a hole area overlapping with the electronic module, an active area overlapping with the sensing electrodes, and a peripheral area adjacent to the active area; a connection line in the hole area and connected to a portion of the sensing electrodes; and a conductive light blocking pattern in the hole area and spaced apart from the connection line and the sensing electrodes.

20 Claims, 26 Drawing Sheets

(52) U.S. Cl.
CPC ...... H01L 27/3248 (2013.01); H01L 51/5056 (2013.01); H01L 51/5096 (2013.01); *G06F 3/0412* (2013.01)

(58) Field of Classification Search
CPC .............. H01L 27/326; H01L 51/5246; H01L 51/5284; H01L 51/5256; H01L 51/0096; H01L 27/3276; H01L 27/3246; H01L 27/3262; H01L 27/3279; H01L 27/3225; G06F 3/0412; G06F 3/0446; G06F 1/1656; G06F 1/1684; G02F 1/133512
See application file for complete search history.

(56) References Cited

U.S. PATENT DOCUMENTS

| | | | |
|---|---|---|---|
| 9,653,368 B2 | 5/2017 | Kwak et al. | |
| 9,947,882 B2 | 4/2018 | Zhang et al. | |
| 10,884,568 B2* | 1/2021 | Seo | G06F 3/0443 |
| 11,047,823 B2* | 6/2021 | Lee | G06F 3/0446 |
| 11,057,554 B2* | 7/2021 | Nakamura | G02F 1/133528 |
| 11,171,311 B2* | 11/2021 | Lee | H01L 51/5253 |
| 2008/0067324 A1 | 3/2008 | Heiler et al. | |
| 2008/0277259 A1 | 11/2008 | Chang | |
| 2009/0213090 A1 | 8/2009 | Mamba et al. | |
| 2011/0032209 A1 | 2/2011 | Kim | |
| 2011/0063237 A1 | 3/2011 | Hung | |
| 2014/0043683 A1 | 2/2014 | Jo et al. | |
| 2014/0098057 A1 | 4/2014 | Lee et al. | |
| 2016/0306472 A1* | 10/2016 | Park | H01L 51/5256 |
| 2016/0307971 A1 | 10/2016 | Jeon | |
| 2016/0315284 A1* | 10/2016 | Jeon | H01L 51/5256 |
| 2017/0045915 A1 | 2/2017 | Pope et al. | |
| 2017/0154566 A1 | 6/2017 | Ryoo et al. | |
| 2017/0162637 A1* | 6/2017 | Choi | G09G 3/3225 |
| 2017/0262109 A1* | 9/2017 | Choi | H01L 51/5253 |
| 2017/0270842 A1 | 9/2017 | Nam et al. | |
| 2017/0287992 A1* | 10/2017 | Kwak | H04M 1/0264 |
| 2017/0299790 A1 | 10/2017 | Ueno et al. | |
| 2017/0353181 A1 | 12/2017 | Kim et al. | |
| 2018/0032189 A1* | 2/2018 | Lee | G06F 3/0443 |
| 2018/0033355 A1 | 2/2018 | Lee et al. | |
| 2018/0033830 A1* | 2/2018 | Kim | G06F 3/0446 |
| 2018/0053466 A1 | 2/2018 | Zhang et al. | |
| 2018/0053792 A1 | 2/2018 | Shin et al. | |
| 2018/0095584 A1* | 4/2018 | Lee | G06F 3/04164 |
| 2018/0151834 A1* | 5/2018 | Kanaya | H01L 29/78666 |
| 2018/0157362 A1 | 6/2018 | Kim et al. | |
| 2018/0158741 A1 | 6/2018 | Kim et al. | |
| 2018/0175116 A1* | 6/2018 | Song | G06F 3/0412 |
| 2018/0204886 A1* | 7/2018 | Lee | G06F 3/0446 |
| 2018/0224984 A1 | 8/2018 | Kim et al. | |
| 2018/0323240 A1* | 11/2018 | Won | H01L 27/322 |
| 2018/0350884 A1* | 12/2018 | Won | G06F 3/044 |
| 2018/0366520 A1* | 12/2018 | Gwon | H01L 51/5072 |
| 2019/0043452 A1 | 2/2019 | Silvanto et al. | |
| 2019/0049483 A1 | 2/2019 | Matsuzawa | |
| 2019/0051859 A1* | 2/2019 | Choi | H01L 51/5253 |
| 2019/0064960 A1 | 2/2019 | Na et al. | |
| 2019/0220123 A1* | 7/2019 | Kanaya | G06F 3/0443 |
| 2019/0233279 A1 | 8/2019 | Yanagisawa | |
| 2020/0034595 A1 | 1/2020 | Jang et al. | |
| 2020/0089369 A1 | 3/2020 | Bang et al. | |
| 2020/0173949 A1 | 6/2020 | Lee et al. | |
| 2020/0174598 A1* | 6/2020 | Kanaya | G06F 3/0445 |
| 2020/0175900 A1* | 6/2020 | Han | G06F 3/0446 |
| 2020/0175901 A1 | 6/2020 | Lee et al. | |
| 2020/0210005 A1* | 7/2020 | Kim | G06F 3/0446 |
| 2020/0236259 A1* | 7/2020 | Nakamura | G02F 1/133345 |
| 2021/0173505 A1* | 6/2021 | Choi | G06F 3/0412 |
| 2021/0349546 A1 | 11/2021 | Morrison et al. | |

FOREIGN PATENT DOCUMENTS

| | | |
|---|---|---|
| KR | 10-2014-0020095 A | 2/2014 |
| KR | 10-2017-0107616 A | 9/2017 |
| KR | 10-2017-0136687 A | 12/2017 |
| KR | 10-2018-0026597 | 3/2018 |
| KR | 10-2018-0042351 A | 4/2018 |
| KR | 10-2018-0049296 A | 5/2018 |
| KR | 10-2018-0063633 A | 6/2018 |
| KR | 10-2021564 | 9/2019 |
| KR | 10-2020-0033362 | 3/2020 |
| KR | 10-2020-0065189 | 6/2020 |
| KR | 10-2020-0066415 | 6/2020 |
| KR | 10-2020-0066445 | 6/2020 |

OTHER PUBLICATIONS

U.S. Office Action from U.S. Appl. No. 16/695,984, dated Sep. 17, 2020, 19 pages.

U.S. Office Action from U.S. Appl. No. 17/361,192, dated Feb. 17, 2022, 24 pages.

Notice of Allowance for U.S. Appl. No. 16/695,984 dated Feb. 18, 2021, 10 pages.

US Notice of Allowance dated Jul. 11, 2022, issued in U.S. Appl. No. 17/361,192 (12 pages).

* cited by examiner

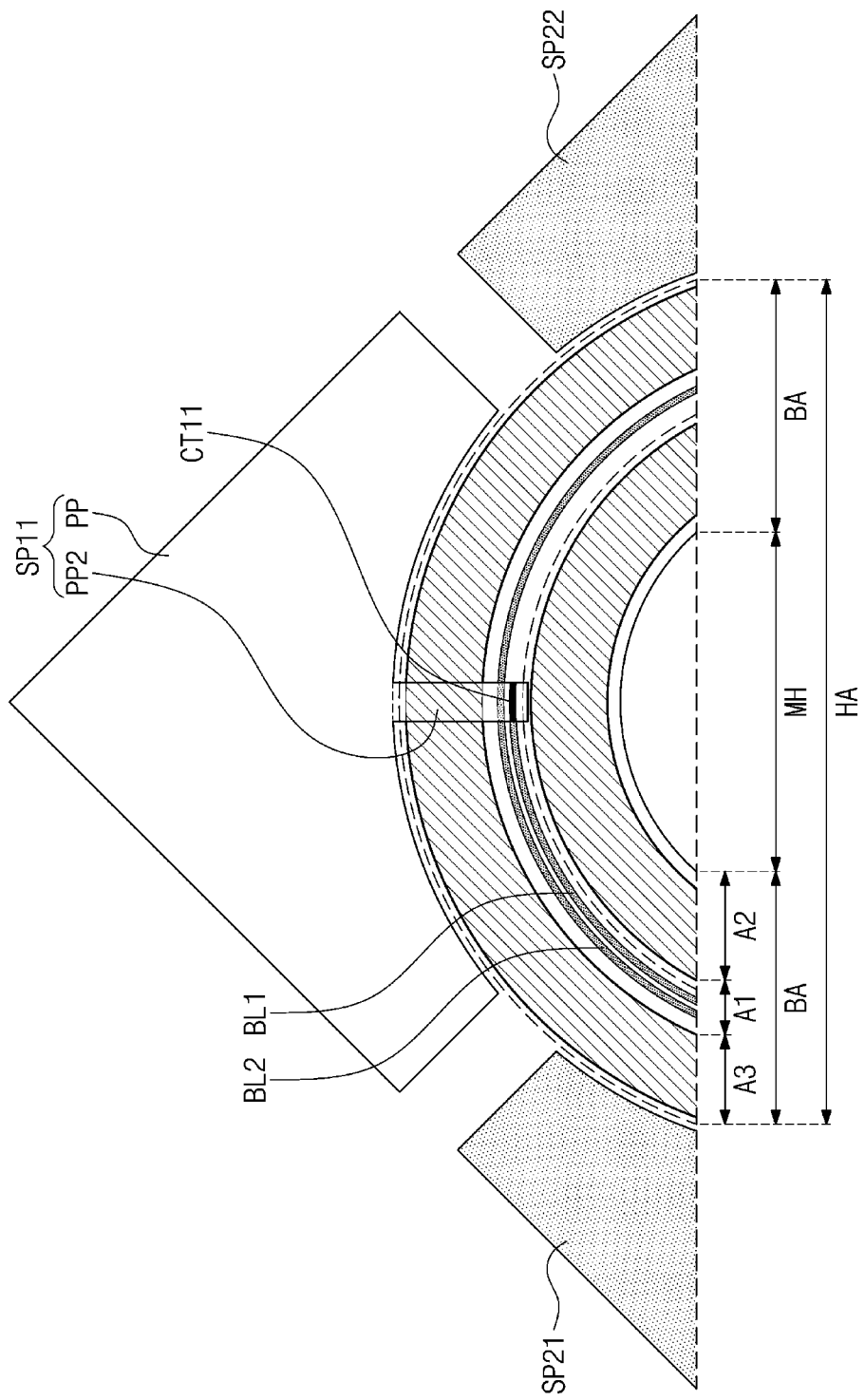

ELECTRONIC APPARATUS

CROSS-REFERENCE TO RELATED APPLICATION

This application claims priority to and the benefit of Korean Patent Application No. 10-2019-0043495, filed on Apr. 15, 2019, the contents of which are hereby incorporated by reference in its entirety.

BACKGROUND

1. Field

Aspects of some example embodiments of the present disclosure relate to an electronic apparatus.

2. Description of the Related Art

An electronic apparatus may be activated in response to electrical signals applied thereto. The electronic apparatus includes devices of various electronic components, for example, a display unit that displays an image or an input sensing unit that senses an external input. The electronic components are electrically connected to each other by signal lines arranged in various ways.

The display unit includes a light emitting device that generates the image. The sensing unit includes sensing electrodes to sense the external input. The sensing electrodes are arranged in an active area. The display unit and the sensing unit are designed to provide the image and an even sensitivity to an entirety of the active area.

Signal lines or driving devices that form the display unit and the sensing unit are arranged in the entire of the active area. The active area is an area that is mainly exposed to a user, an area that is easily visible to the user, and an area where an external light is easily incident.

The above information disclosed in this Background section is only for enhancement of understanding of the background and therefore the information discussed in this Background section does not necessarily constitute prior art.

SUMMARY

Aspects of some example embodiments of the present disclosure relate to an electronic apparatus. For example, the present disclosure relates to an electronic apparatus capable of sensing an external input.

Aspects of some example embodiments of the present disclosure include an electronic apparatus having improved visibility by reducing a reflection of an external light.

According to some example embodiments of the inventive concept, an electronic apparatus includes an electronic panel including a display unit including a plurality of pixels and a sensing unit including a plurality of sensing electrodes and an electronic module located to overlap with the electronic panel when viewed in a plan view. The sensing unit includes a base substrate including a hole area overlapping with the electronic module, an active area overlapping with the sensing electrodes, and a peripheral area located adjacent to the active area, a connection line located in the hole area and connected to a portion of the sensing electrodes, and a conductive light blocking pattern located in the hole area and spaced apart from the connection line and the sensing electrodes.

According to some example embodiments, the hole area includes a hole transmission area overlapping with the electronic module, a first area spaced apart from the hole area, the connection line located in the first area, a second area defined between the first area and the hole transmission area, and a third area defined between the first area and the active area. The conductive light blocking pattern includes a first light blocking pattern located in the second area and a second light blocking pattern located in the third area, and each of the first light blocking pattern and the second light blocking pattern is spaced apart from the connection line when viewed in the plan view.

According to some example embodiments, the first light blocking pattern has a closed line shape that surrounds the hole transmission area.

According to some example embodiments, the second light blocking pattern overlaps with at least a portion of the pixels in the plan view.

According to some example embodiments, the sensing electrodes include a first sensing electrode including a plurality of first sensing patterns and a plurality of first connection patterns each being located between the first sensing patterns to connect the first sensing patterns adjacent to each other and a second sensing electrode including a plurality of second connection patterns spaced apart from the first connection patterns with a sensing insulating layer interposed therebetween and a plurality of second sensing patterns spaced apart from the first sensing patterns and connected to the second connection patterns. The conductive light blocking pattern is located on a same layer as one of the first connection patterns and the second connection patterns.

According to some example embodiments, the conductive light blocking pattern is located on a different layer from the first sensing patterns and overlaps with at least one of the first sensing patterns and the second sensing patterns.

According to some example embodiments, a portion of the first sensing patterns is connected to the connection line, and the portion overlaps with the conductive light blocking pattern in the plan view.

According to some example embodiments, the conductive light blocking pattern is located on a same layer as the first sensing patterns and is spaced apart from the first sensing patterns and the second sensing patterns in the plan view.

According to some example embodiments, the conductive light blocking pattern includes a material different from the first sensing patterns.

According to some example embodiments, the electronic panel includes a hole penetrating through the hole transmission area.

According to some example embodiments, the conductive light blocking pattern includes a floating pattern.

According to some example embodiments, the conductive light blocking pattern receives a ground voltage.

According to some example embodiments of the inventive concept, an electronic apparatus includes a display unit including a base substrate including a hole transmission area, a light blocking area located adjacent to the hole transmission area, and an active area located adjacent to the light blocking area and a plurality of light emitting elements located on the base substrate and located in the active area, a sensing unit including a plurality of sensing electrodes located on the display unit and located in the active area, a connection line located in the light blocking area and connected to a portion of the sensing electrodes, and a conductive light blocking pattern located in the light blocking area and located on a same layer as at least a portion of the sensing electrodes, a window located on the sensing unit, and an anti-reflective member located between the window and the sensing unit. The conductive light blocking pattern includes a first light blocking pattern located between the hole transmission area and the connection line and a second light blocking pattern spaced apart from the first light blocking pattern and located between the connection line and the active area.

According to some example embodiments, an opening is defined in the display unit to overlap with the hole transmission area and to penetrate through the anti-reflective member.

According to some example embodiments, the anti-reflective member includes a polarizing portion overlapping with the active area and a transmitting portion overlapping with the hole transmission area and having a transmittance higher than the polarizing portion.

According to some example embodiments, the display unit further includes light emitting elements that overlap with at least a portion of the light blocking pattern.

According to some example embodiments, the sensing electrodes include a first sensing electrode including a first connection pattern and a first sensing pattern located on a different layer from the first connection pattern and connected to the first connection pattern and a second sensing electrode including a second connection pattern located on a same layer as the first sensing pattern and a second sensing pattern located on a same layer as the second connection pattern and connected to the second connection pattern. The first and second light blocking patterns are located on a same layer as one of the first connection pattern and the second connection pattern.

According to some example embodiments, the display unit and the sensing unit are provided with a hole defined therethrough, and the window covers the hole.

According to some example embodiments, the display unit further includes a sealing member that surrounds the hole transmission area, and the first light blocking pattern overlaps with the sealing member when viewed in a plan view.

According to some example embodiments, each of the first light blocking pattern and the second light blocking pattern is electrically floated or receives a ground voltage.

According to the above, although a separate component, such as a black matrix, may be omitted, the area defined adjacent to the electronic module may be easily blocked. Therefore, defects in display characteristics caused by the reflection of the external light in the area defined adjacent to the electronic module may be resolved or reduced in the electronic panel, and a manufacturing process of the electronic apparatus may be simplified.

BRIEF DESCRIPTION OF THE DRAWINGS

The above and other characteristics of the present disclosure will become readily apparent by reference to the following detailed description when considered in conjunction with the accompanying drawings wherein:

FIGS. 4A and 4B are plan views showing a portion of the sensing unit according to some example embodiments of the present disclosure;

DETAILED DESCRIPTION

Figure 1A:
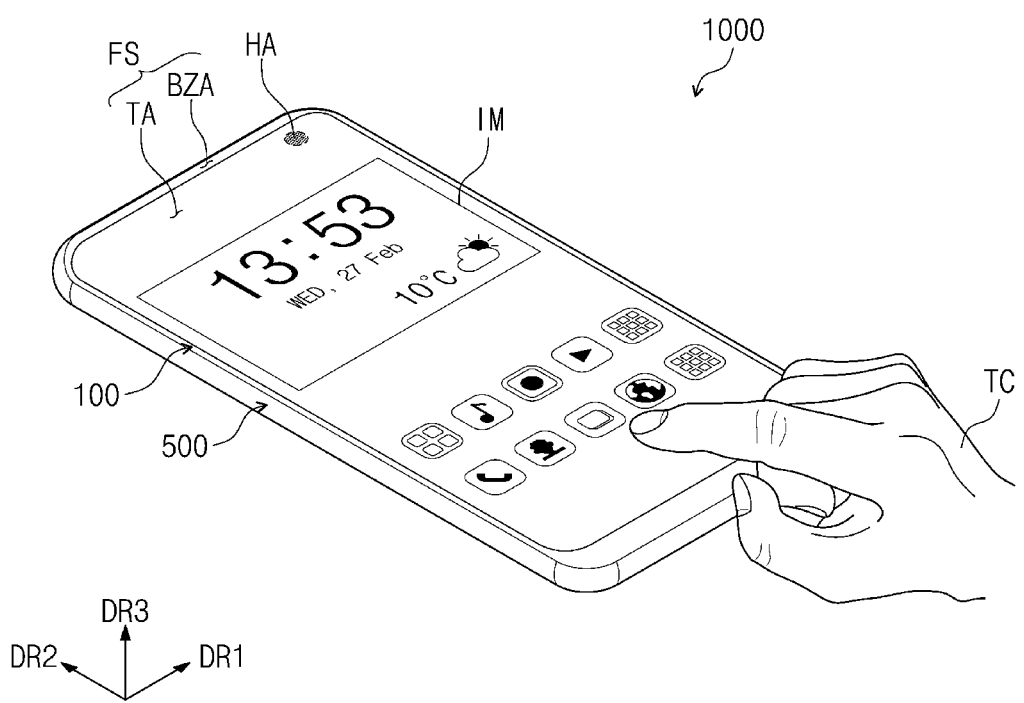
FIG. 1A is an assembled perspective view showing an electronic apparatus according to some example embodiments of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be explained in more detail with reference to the accompanying drawings.

Figure 1B:
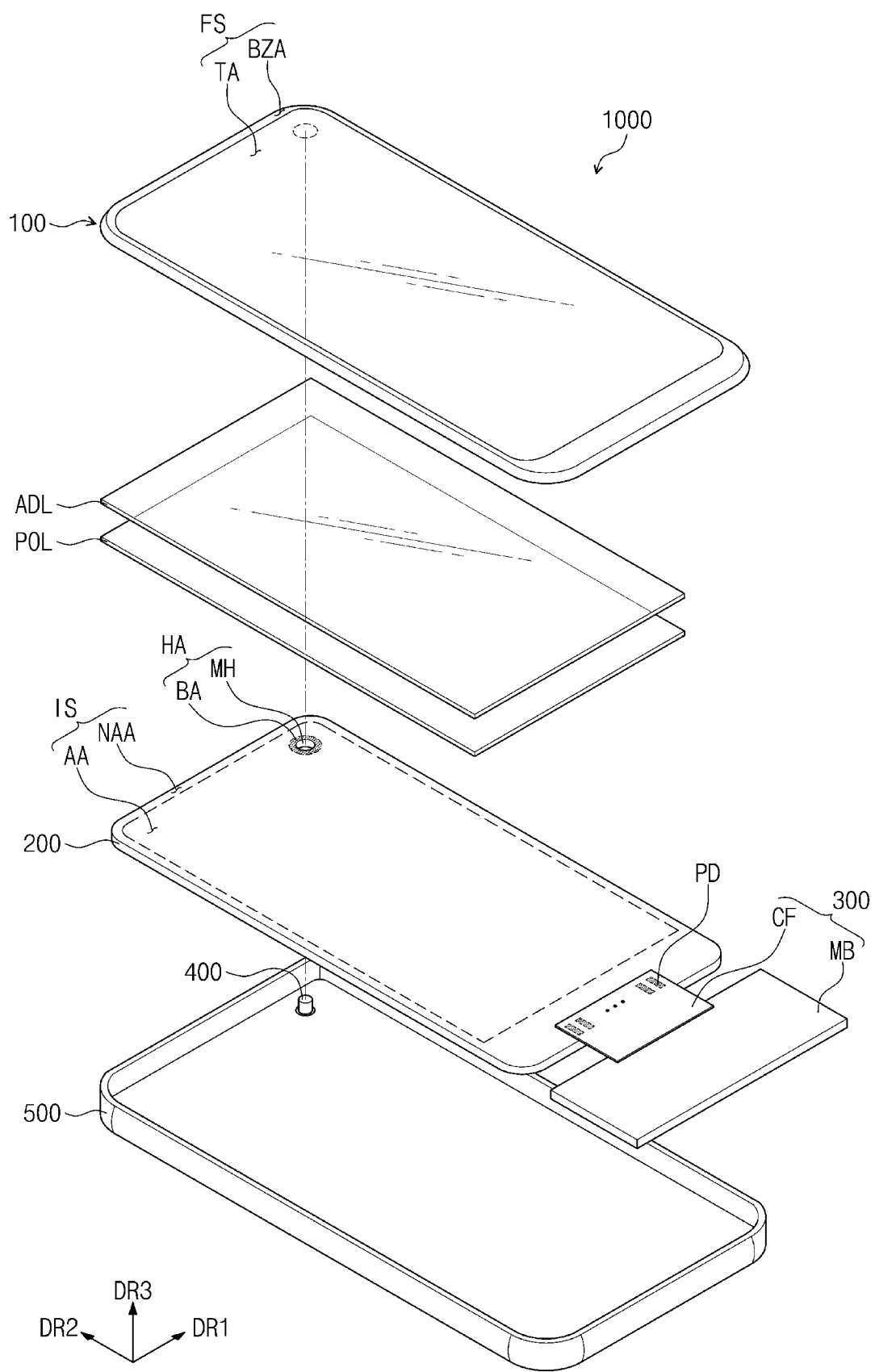
FIG. 1B is an exploded perspective view showing the electronic apparatus shown in FIG. 1A.
Figure 2:
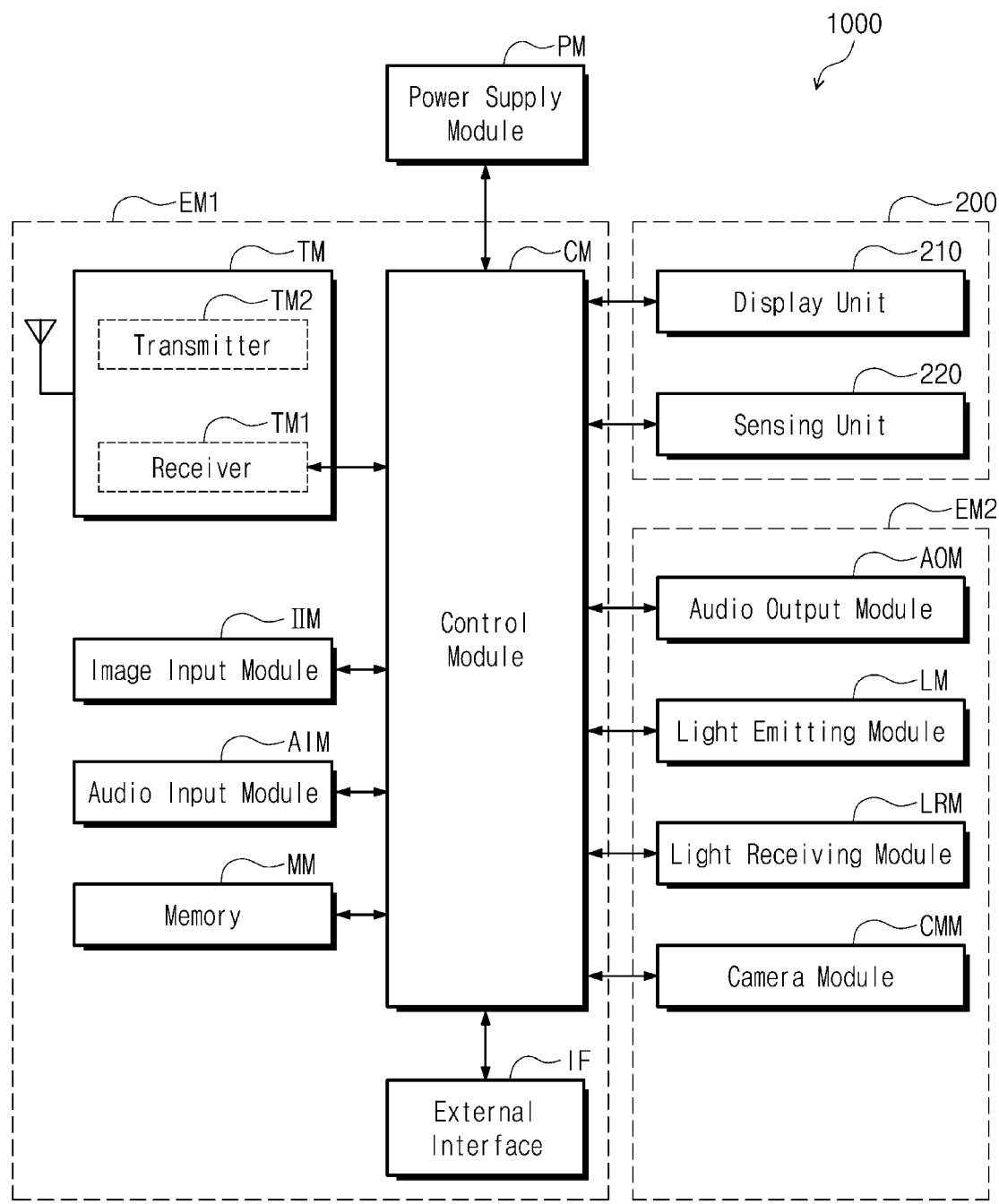
FIG. 2 is a block diagram showing the electronic apparatus shown in FIG. 1A.

FIG. 1A is an assembled perspective view showing an electronic apparatus 1000 according to some example embodiments of the present disclosure. FIG. 1B is an exploded perspective view showing the electronic apparatus 1000 shown in FIG. 1A. FIG. 2 is a block diagram showing the electronic apparatus 1000 shown in FIG. 1A. Hereinafter, aspects of some example embodiments of the present disclosure will be described with reference to FIGS. 1A, 1B, and 2.

The electronic apparatus 1000 may be an apparatus activated in response to electrical signals applied thereto. The electronic apparatus 1000 may include various embodiments. For example, the electronic apparatus 1000 may be a tablet computer, a notebook computer, a computer, or a smart television. According to some example embodiments, a smartphone will be described as a representative example of the electronic device 1000.

Referring to FIGS. 1A and 1B, the electronic apparatus 1000 may display an image on a front surface FS thereof. The front surface FS may be defined to be substantially parallel to a surface defined by a first direction DR1 and a second direction DR2. The front surface FS includes a transmission area TA and a bezel area BZA defined adjacent to the transmission area TA.

The electronic apparatus 1000 displays the image IM through the transmission area TA. The image IM includes at least one of a still image and a motion image. FIG. 1A shows a clock widget and application icons as a representative example of the image IM.

The transmission area TA may have a quadrangular shape parallel to each of the first direction DR1 and the second direction DR2, however, this is merely an example. The transmission area TA may include various shapes and should not be limited particularly.

The bezel area BZA is defined adjacent to the transmission area TA. The bezel area BZA may surround the transmission area TA. However, this is merely an example, and the bezel area BZA may be defined adjacent to only one side of the transmission area TA or may be omitted. The electronic apparatus 1000 according to some example embodiments of the present disclosure may include various embodiments and should not be limited to a particular embodiment.

A normal line direction of the front surface may correspond to a thickness direction DR3 (hereinafter, referred to as a "third direction") of the electronic apparatus 1000. According to some example embodiments, front (or upper) and rear (or lower) surfaces of each member are defined with respect to a direction in which the image IM is displayed. The front and rear surfaces are opposite to each other in the third direction DR3.

Directions indicated by the first, second, and third directions DR1, DR2, and DR3 are relative to each other, and thus the directions indicated by the first, second, and third directions DR1, DR2, and DR3 may be changed to other directions. Hereinafter, the first, second, and third directions are respectively indicated by the first, second, and third directions DR1, DR2, and DR3 and assigned with the same reference numerals.

Meanwhile, the electronic apparatus 1000 may sense an external input TC applied thereto from the outside. The external input TC may include various types of external inputs, such as a portion of user's body, light, heat, or pressure. In addition, the electronic apparatus 1000 may sense a proximity input as well as a touch input to the electronic apparatus 1000.

According to some example embodiments, the external input TC is shown as a user's hand applied to the front surface, however, this is merely an example. As described above, the external input TC may be provided in various forms, and the electronic apparatus 1000 may sense the external input TC applied to a side or rear surface of the electronic apparatus 1000 depending on a structure of the electronic apparatus 1000, however, they should not be limited to a particular embodiment.

The electronic apparatus 1000 includes a window 100, an electronic panel 200, an anti-reflective member POL, an adhesive member ADL, a circuit board 300, an electronic module 400, and an external case 500. The window 100 and the external case 500 are coupled to each other to define an appearance of the electronic apparatus 1000.

The window 100 is located on the electronic panel 200 to cover a front surface IS of the electronic panel 200. The window 100 includes an optically transparent insulating material. For example, the window 100 includes glass or plastic. The window 100 has a single-layer or multi-layer structure. For example, the window 100 has a stacked structure of a plurality of plastic films attached to each other by an adhesive or a stacked structure of a glass substrate and a plastic film, which are attached to each other by an adhesive.

The window 100 includes a front surface FS exposed to the outside. The front surface FS of the electronic apparatus 1000 may be defined by the front surface FS of the window.

For example, the transmission area TA may be an optically transparent area. The transmission area TA may have a shape corresponding to an active area AA. For example, the transmission area TA may overlap with at least a portion or entire surface of the active area AA. The image IM displayed through the active area AA of the electronic panel 200 may be viewed from the outside through the transmission area TA.

The bezel area BZA may be an area having a light transmittance relatively lower than that of the transmission area TA. The bezel area BZA may define a shape of the transmission area TA. The bezel area BZA may be located adjacent to the transmission area TA and may surround the transmission area TA.

The bezel area BZA may have a predetermined color. In a case where the window 100 is provided in a glass or plastic substrate, the bezel area BZA may be a color layer printed on or deposited on one surface of the glass or plastic substrate. As another way, the bezel area BZA may be formed by coloring a corresponding area of the glass or plastic substrate.

The bezel area BZA may cover a peripheral area NAA of the electronic panel 200 to prevent the peripheral area NAA from being perceived from the outside. However, this is merely an example, and the bezel area BZA may be omitted from the window 100 according to another embodiment of the present disclosure.

The electronic panel 200 may display the image IM and may sense the external input TC. The electronic panel 200 may include the front surface IS in which the active area AA and the peripheral area NAA are defined. The active area AA may be an area activated in response to electrical signals.

According to some example embodiments, the active area AA may be the area in which the image IM is displayed and the external input TC is sensed. The transmission area TA may overlap with at least the active area AA. For example, the transmission area TA may overlap with at least a portion or entire surface of the active area AA. Therefore, the user may perceive the image IM through the transmission area TA or may apply the external input TC through the transmission area TA, however, this is merely an example. The area in which the image IM is displayed in the active area AA may be separated from the area in which the external input TC is sensed in the active area AA.

The peripheral area NAA may be covered by the bezel area BZA. The peripheral area NAA may be located adjacent to the active area AA. The peripheral area NAA may surround the active area AA. A driving circuit or a driving line may be located in the peripheral area NAA to drive the active area AA.

Various signal lines, pads PD, or electronic devices may be arranged in the peripheral area NAA to apply electrical signals to the active area AA. The peripheral area NAA may be covered by the bezel area BZA, and thus the peripheral area NAA may not be visible from the outside.

According to some example embodiments, the electronic panel 200 is assembled in a flat state in which the active area AA and the peripheral area NAA face the window 100. However, this is merely an example, and a portion of the peripheral area NAA of the electronic panel 200 may be bent. In this case, the portion of the peripheral area NAA faces the rear surface of the electronic apparatus 1000, and the bezel area BZA may be reduced in the front surface of the electronic apparatus 1000. As another example, the electronic panel 200 may be assembled in a state in which a portion of the active area AA is bent. As another example, the peripheral area NAA may be omitted from the electronic panel 200 according to another embodiment of the present disclosure.

Referring to FIG. 2, the electronic panel 200 may include a display unit 210 and a sensing unit 220. The display unit 210 may have a configuration that substantially generates the image IM. The image IM generated by the display unit 210 may be viewed from the outside to the user through the transmission area TA.

The sensing unit 220 may sense the external input TC applied thereto from the outside. As described above, the sensing unit 220 may sense the external input TC applied to the window 100.

A predetermined hole area HA (or a first area) may be defined in the electronic panel 200. The hole area HA may have a relatively higher transmittance than the active area AA (or a second area) based on the same area. The hole area HA may be defined at a location corresponding to an electronic module 400 described later when viewed in a plan view.

At least a portion of the hole area HA may be surrounded by the active area AA. According to some example embodiments, the hole area HA may be spaced apart from the peripheral area NAA (or a third area). The hole area HA may be defined in the active area AA such that an entire edge of the hole area HA is surrounded by the active area AA. When the electronic apparatus 1000 according to some example embodiments is in an assembled state, the hole area HA may be defined in the transmission area TA at a location spaced apart from the bezel area BZA.

According to some example embodiments, the hole area HA may include a hole MH and a light blocking area BA. The hole MH may be defined at a center of the hole area HA and may penetrate through the display unit 210. The light blocking area BA may surround an edge of the hole MH. The light blocking area BA may be an area viewed from the outside as a black color. This will be described in more detail later.

The electronic panel 200 may be provided with the hole MH defined in the hole area HA to penetrate through the electronic panel 200. The hole MH may penetrate through at least one of the display unit 210 and the sensing unit 220. The edge of the hole area HA may be spaced apart from the edge of the hole MH and may extend along the edge of the hole MH. The edge of the hole area HA may have a shape corresponding to the hole MH.

The anti-reflective member POL may be located between the window 100 and the electronic panel 200. The anti-reflective member POL may lower a reflectance of an external light, which is incident from the outside of the window 100, with respect to the electronic panel 200. According to some example embodiments, the anti-reflective member POL may include a polarizing film or a color filter.

The adhesive member ADL may be located between the anti-reflective member POL and the window 100. The adhesive member ADL may couple the anti-reflective member POL to the window 100. In a case where the anti-reflective member POL according to some example embodiments of the present disclosure is the color filter formed on the electronic panel 200, the adhesive member ADL may couple the electronic panel 200 and the window 100. The adhesive member ADL may include an optical clear adhesive, an optical clear resin, or a pressure sensitive adhesive, and the adhesive member ADL should not be limited to a particular embodiment as long as the adhesive member ADL is optically transparent.

The circuit board 300 may be connected to the electronic panel 200. The circuit board 300 may include a flexible board CF and a main board MB. The flexible board CF may include an insulating film and conductive lines mounted on the insulating film. The conductive lines may be connected to the pads PD to electrically connect the circuit board 300 to the electronic panel 200.

According to some example embodiments, the flexible board CF may be assembled in the bent state. Accordingly, the main board MB may be located on the rear surface of the electronic panel 200 and may be stably accommodated in a spaced defined by the external case 500. Meanwhile, according to some example embodiments, the flexible board CF may be omitted, and in this case, the main board MB may be directly connected to the electronic panel 200.

The main board MB may include signal lines and electronic devices. The electronic devices may be connected to the signal lines to be electrically connected to the electronic panel 200. The electronic devices may generate various electrical signals, e.g., signals to generate the image IM or signals to sense the external input TC or may process the sensed signals. Meanwhile, the main board MB may be provided in a plural number to respectively correspond to the electrical signals that are to be generated or processed, however, the main board MB should not be particularly limited.

In the electronic apparatus 1000 according to some example embodiments of the present disclosure, a driving circuit that applies the electrical signals to the active area AA may be directly mounted on the electronic panel 200. In this case, the driving circuit may be mounted in the form of chip or may be formed together with pixels PX. Then, the circuit board 300 may be omitted or an area of the circuit board 300 may be reduced. The electronic apparatus 1000 according to some example embodiments of the present disclosure may include various embodiments, and it should not be limited to a particular embodiment.

The electronic module 400 is located under the window 100. The electronic module 400 may overlap with the hole MH when viewed in a plan view and may overlap with the hole area HA. The electronic module 400 may receive the external input transmitted thereto via the hole area HA or may provide an output via the hole area HA.

In the electronic module 400, a receiving portion that receives the external input or an output portion that provides the output may overlap with the hole area HA when viewed in a plan view. The electronic module 400 may be located on the rear surface of the electronic panel 200 or at least a portion of the electronic module 400 may be located in the hole MH. According to some example embodiments of the present disclosure, the electronic module 400 is located to overlap with the active area AA, and thus the bezel area BZA may be prevented from increasing.

Referring to FIG. 2, the electronic apparatus 1000 may include the electronic panel 200, a power supply module PM, a first electronic module EM1, and a second electronic module EM2. The electronic panel 200, the power supply module PM, the first electronic module EM1, and the second electronic module EM2 are electrically connected to each other. FIG. 2 shows the display unit 210 and the sensing unit 220 among components of the electronic panel 200 as a representative example.

The first electronic module EM1 and the second electronic module EM2 may include various functional modules to operate the electronic apparatus 1000. The first electronic module EM1 may be directly mounted on a mother board electrically connected to the electronic panel 200 or may be electrically connected to the mother board through a connector after being mounted on a separate board.

The first electronic module EM1 may include a control module CM, a wireless communication module TM, an image input module IIM, an audio input module AIM, a memory MM, and an external interface IF. Some of the modules may be electrically connected to the mother board through a flexible printed circuit board without being mounted on the mother board.

The control module CM may control the overall operation of the electronic apparatus 1000. The control module CM may be, but not limited to, a microprocessor. For example, the control module CM may activate or deactivate the electronic panel 200. The control module CM may control other modules, e.g., the image input module IIM or the audio input module AIM, based on a touch signal provided from the electronic panel 200.

The wireless communication module TM may transmit/receive a wireless signal to/from another terminal by using a Bluetooth or Wi-Fi line. The wireless communication module TM may transmit/receive a voice signal by using a conventional communication line. The wireless communication module TM may include a transmitter TM1 that modulates a signal to be transmitted and transmits the modulated signal and a receiver TM2 that demodulates the signal applied thereto.

The image input module IIM may process an image signal and convert the image signal into image data that may be displayed through the electronic panel 200. The audio input module AIM may receive an external audio signal through a microphone in a recording mode and a voice recognition mode and converts the audio signal into electrical voice data.

The external interface IF may serve as an interface between the control module CM and external devices, such as an external charger, a wired/wireless data port, and a card socket (e.g., a memory card and a SIM/UIM card).

The second electronic module EM2 includes an audio output module AOM, a light emitting module LM, a light receiving module LRM, and a camera module CMM. The components of the second electronic module EM2 may be directly mounted on the mother board, electrically connected to the electronic panel 200 through a connector after being mounted on a separate substrate, or electrically connected to the first electronic module EM1.

The audio output module AOM may convert and output the audio data provided from the wireless communication module TM or the audio data stored in the memory MM to the outside.

The light emitting module LM may generate and emit a light. The light emitting module LM may emit an infrared light. The light emitting module LM may include a light emitting diode (LED) device. The light receiving module LRM may sense the infrared light. The light receiving module LRM may be activated when sensing the infrared light equal to or greater than a predetermined level. The light receiving module LRM may include a complementary metal oxide semiconductor (CMOS) sensor. The infrared light generated by the light emitting module LM may be incident into the light receiving module LRM after being output from the light emitting module LM and being reflected by an external object, e.g., a user's finger or face. The camera module CMM may photograph an external image.

The electronic module 400 according to some example embodiments of the present disclosure may include at least one of the components of the first electronic module EM1 and the second electronic module EM2. For example, the electronic module 400 may include at least one of a camera, a speaker, a light sensing sensor, and a heat sensing sensor. The electronic module 400 may sense an external subject provided through the hole area HA or may provide a sound signal such as a voice to the outside. In addition, the electronic module 400 may include a plurality of components, however, it should not be limited to a particular embodiment.

The electronic module 400 arranged to overlap with the hole area HA may easily recognize the external subject via the hole area HA, or the output signal generated by the electronic module 400 may be easily transmitted to the outside. Meanwhile, the electronic apparatus 1000 according to some example embodiments of the present disclosure may further include a transparent member located between the electronic module 400 and the electronic panel 200. The transparent member may be optically transparent film so that the external input transmitted through the hole MH is transmitted to the electronic module 400 after passing through the transparent member. The transparent member may be attached to the rear surface of the electronic panel 200 or may be located between the electronic panel 200 and the electronic module 400 without a separate adhesive. The electronic apparatus 1000 according to some example embodiments of the present disclosure may have various structures, and it should not be limited to a particular embodiment.

According to some example embodiments of the present disclosure, the electronic module 400 may be assembled to overlap with the transmission area TA when viewed in a plan view. Accordingly, the increase of the bezel area BZA due to the accommodation of the electronic module 400 may be prevented, and thus an aesthetic design of the electronic apparatus 1000 may be improved.

Figure 3A:
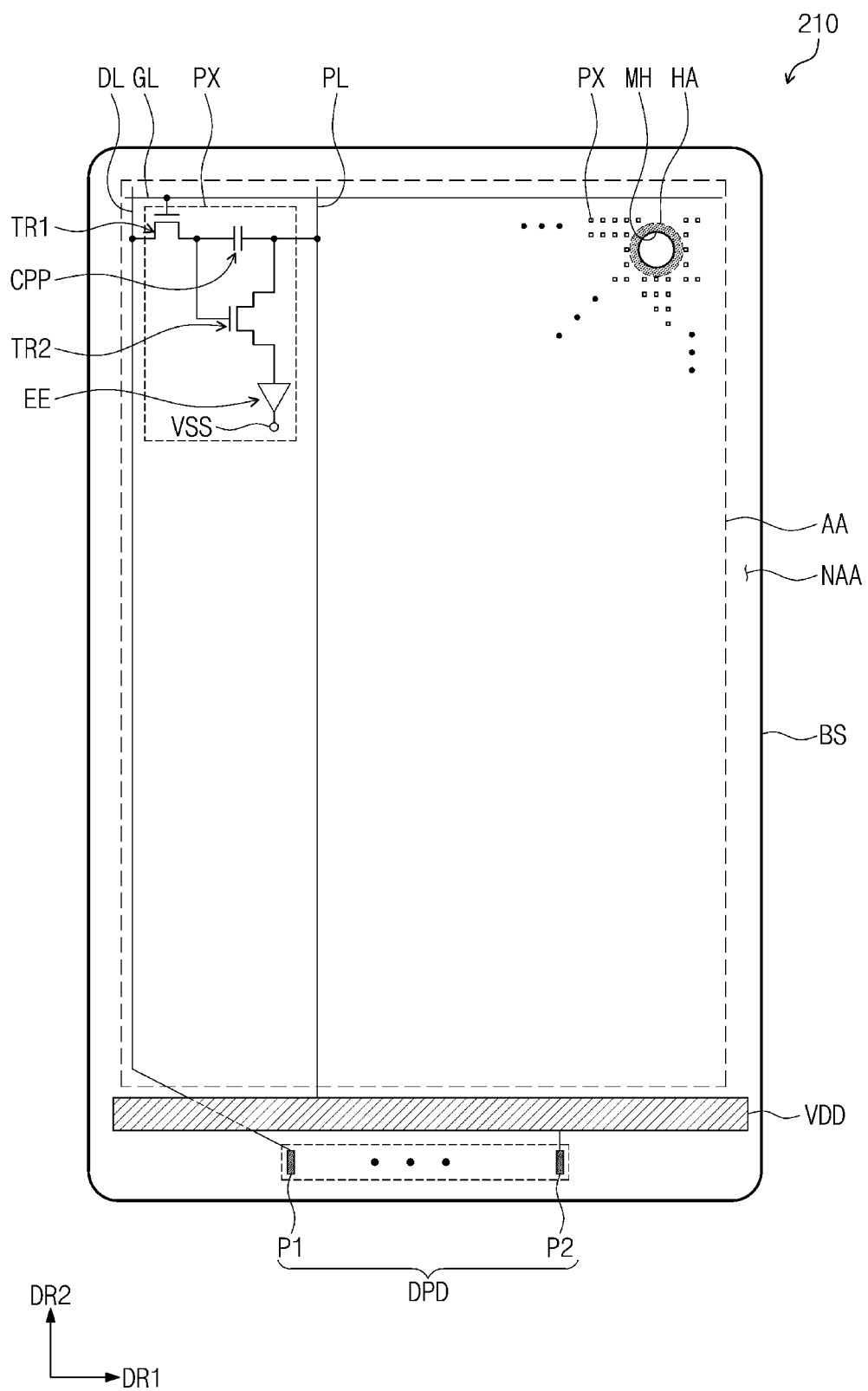
FIG. 3A is a plan view showing a display unit according to some example embodiments of the present disclosure.
Figure 3B:
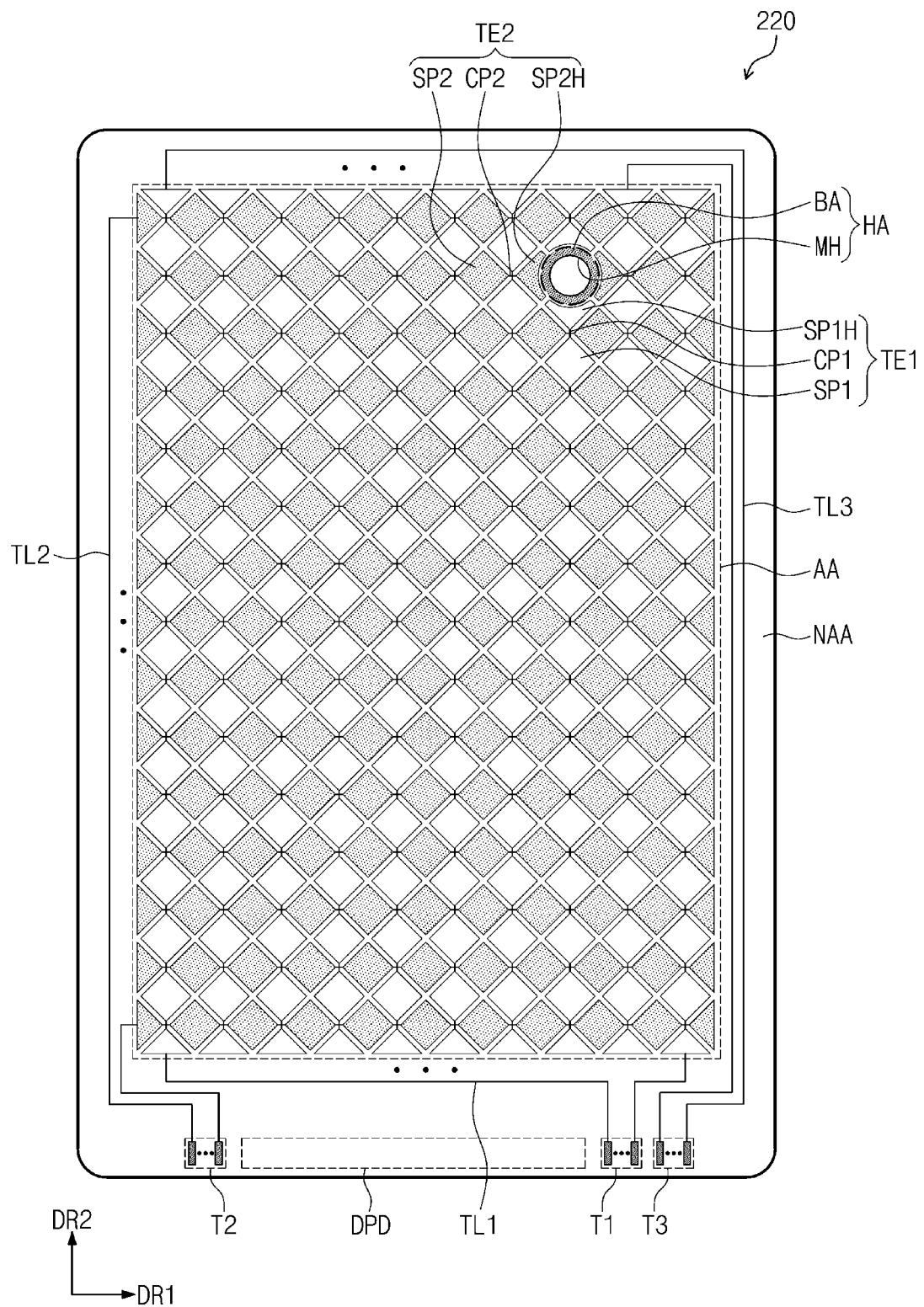
FIG. 3B is a plan view showing a sensing unit according to some example embodiments of the present disclosure.
Figure 4A:
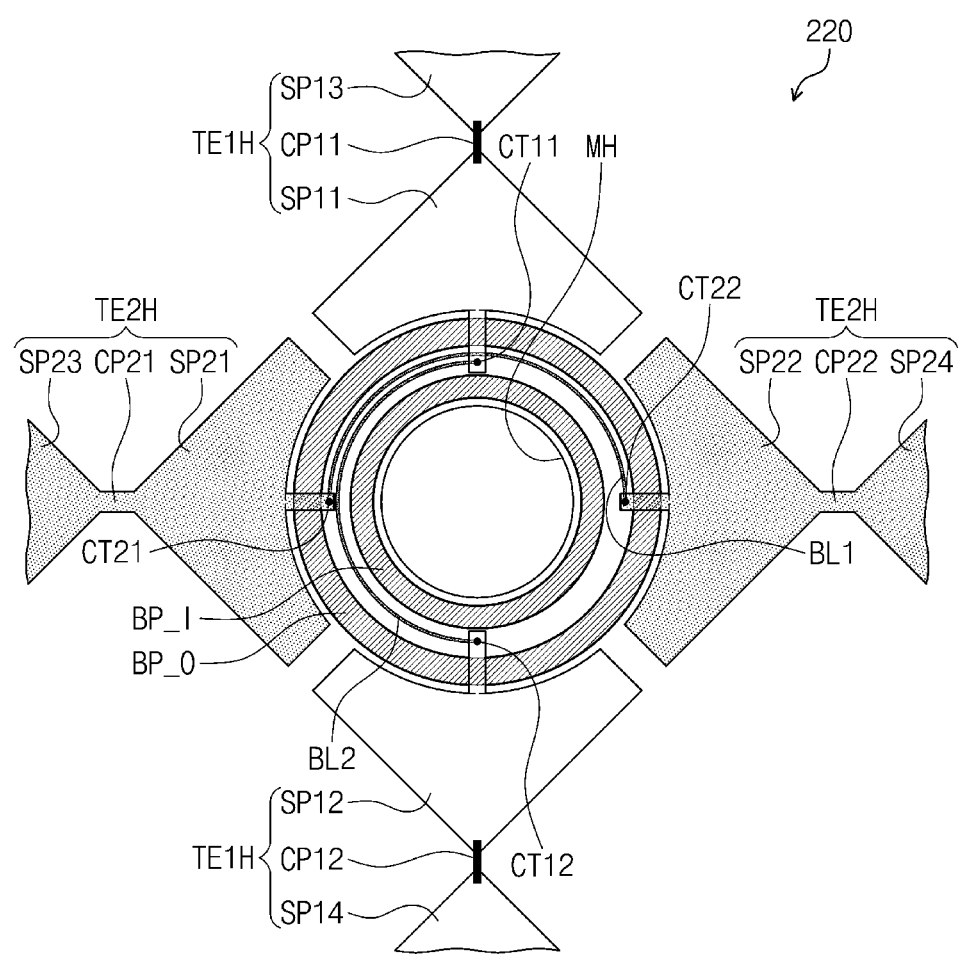

FIG. 3A is a plan view showing the display unit 210 according to some example embodiments of the present disclosure. FIG. 3B is a plan view showing the sensing unit 220 according to some example embodiments of the present disclosure. FIGS. 4A and 4B are plan views showing a portion of the sensing unit 220. FIG. 4A shows a portion of the sensing unit 220, which is adjacent to the hole area HA, and FIG. 4B is an enlarged view of a portion of the sensing unit 220 of FIG. 4A. Hereinafter, the present disclosure will be described in more detail with reference to FIGS. 3A, 3B, 4A, and 4B.

Referring to FIG. 3A, the display unit 210 may include a base substrate BS, a plurality of pixels PX, a plurality of signal lines GL, DL, and PL, a power pattern VDD, and a plurality of display pads DPD.

The active area AA and the peripheral area NAA may be areas provided by the base substrate BS. The base substrate BS may include an insulating substrate. For example, the base substrate BS may include a glass substrate, a plastic substrate, or a combination thereof. As another example, the base substrate BS may include a metal substrate. The base substrate BS may be provided flexibly so as to be foldable by the user or may be rigidly provided so as not to be deformed. The base substrate BS according to some example embodiments of the present disclosure may include various embodiments as long as configurations, such as the pixels PX or the signal lines GL, DL, and PL, are arranged, and it should not be limited to a particular embodiment.

The signal lines GL, DL, and PL may be connected to the pixels PX and may transmit electrical signals to the pixels PX. Among the signal lines included in the display unit 210, a scan line GL, a data line DL, and a power line PL are shown as a representative example. However, this is merely an example. The signal lines GL, DL, and PL may further include at least one of a power line, an initialization voltage line, and a light emitting control line and should not be particularly limited.

The pixels PX may be arranged in the active area AA. According to some example embodiments, a signal circuit diagram of one pixel PX of the pixels is enlarged and shown as a representative example. The pixel PX may include a first thin film transistor TR1, a capacitor CPP, a second thin film transistor TR2, and a light emitting element EE.

The first thin film transistor TR1 may be connected to the scan line GL and the data line DL. The capacitor CPP may be connected to the first thin film transistor TR1 and the power line PL. The second thin film transistor TR2 may be connected to the first thin film transistor TR1, the capacitor CPP, and the light emitting element EE. The first thin film transistor TR1, the capacitor CPP, and the second thin film transistor TR2 may control an operation of the light emitting element EE.

The light emitting element EE may emit a light with time and intensity corresponding to a data signal transmitted through the data line DL. For example, the light emitting element EE may include an organic light emitting element, a quantum dot light emitting element, an electrophoretic element, or an electrowetting element.

The light emitting element EE may be connected to a power terminal VSS to receive a power signal (hereinafter, referred to as a "second power signal") different from a power signal (hereinafter, referred to as a "first power signal") provided through the power line PL. The light emitting element EE may generate the light corresponding to a difference between an electrical signal provided from the second thin film transistor TR2 and the second power signal. This is merely an example, and each pixel PX may include electronic devices having various configurations and arrangements and should not be limited to a particular embodiment.

The pixels PX may be arranged around the hole area HA. According to some example embodiments, a boundary between the hole area HA and the active area AA may have a closed line shape. According to some example embodiments, the boundary between the hole area HA and the active area AA has a circular shape as a representative example.

The power pattern VDD may be located in the peripheral area NAA. According to some example embodiments, the power pattern VDD may be connected to a plurality of power lines PL. Accordingly, as the display unit 210 includes the power pattern VDD, the same first power signal may be provided to each of the pixels PX.

The display pads DPD may include a first pad P1 and a second pad P2. The first pad P1 may be provided in a plural number, and the first pads P1 may be connected to data lines DL, respectively. The second pad P2 may be connected to the power pattern VDD and may be electrically connected to the power line PL. The display unit 210 may apply the electrical signals applied thereto from the outside to the pixels PX via the display pads DPD. Meanwhile, the display pads DPD may further include pads in addition to the first and second pads P1 and P2 to receive other electrical signals, and it should not be limited to a particular embodiment.

Referring to FIG. 3B, the sensing unit 220 has a shape corresponding to the display unit 210. According to some example embodiments, the sensing unit 220 may be located on the display unit 210, however, this is merely an example. The sensing unit 220 may be located under the display unit 210 or may be embedded in the display unit 210, and it should not be limited to a particular embodiment.

The sensing unit 220 may sense the external input TC (refer to FIG. 1A) to obtain information about position and intensity of the external input TC. The sensing unit 220 may include a plurality of first sensing electrodes TE1, a plurality of second sensing electrodes TE2, a plurality of lines TL1, TL2, and TL3, and a plurality of sensing pads T1, T2, and T3.

The first sensing electrodes TE1 and the second sensing electrodes TE2 are arranged in the active area AA. The sensing unit 220 may obtain information about the external input TC based on a variation in capacitance between the first sensing electrodes TE1 and the second sensing electrodes TE2.

The first sensing electrodes TE1 may be arranged in the first direction DR1 and may extend in the second direction DR2. Each of the first sensing electrodes TE1 may include a first main pattern SP1, a first adjacent pattern SP1 H, and a first connection pattern CP1.

The first main pattern SP1 may be located in the active area AA. The first main pattern SP1 is located to be spaced apart from the hole area HA. The first main pattern SP1 may have a predetermined shape and may have a first area. According to some example embodiments, the first main pattern SP1 may have a lozenge shape, however, this is merely an example. The first main pattern SP1 may have various shapes, and it should not be limited to a particular embodiment.

The first adjacent pattern SP1H may be located adjacent to the hole area HA. The hole MH according to some example embodiments may penetrate through the sensing unit 220. The first adjacent pattern SP1H may have a second area smaller than the first area of the first main pattern SP1. The first adjacent pattern SP1H may have a shape obtained by removing an area overlapping with the hole area HA from the same lozenge shape as the first main pattern SP1.

According to some example embodiments, the first connection pattern CP1 may extend along the second direction DR2. The first connection pattern CP1 may be connected to the first main pattern SP1. The first connection pattern CP1 may be located between two first main patterns to connect the two first main patterns to each other. As another way, the first connection pattern CP1 may be located between the first main pattern SP1 and the first adjacent pattern SP1H to connect the first main pattern SP1 and the first adjacent pattern SP1H.

The second sensing electrodes TE2 may be arranged in the second direction DR2 and may extend in the first direction DR1. Each of the second sensing electrodes TE2 may include a second main pattern SP2, a second adjacent pattern SP2H, and a second connection pattern CP2.

The second main pattern SP2 may be arranged to be spaced apart from the hole area HA. The second main pattern SP2 may be spaced apart from the first main pattern SP1. According to some example embodiments, the separation between the first main pattern SP1 and the second main pattern SP2 may be a separation on a cross section. The first main pattern SP1 and the second main pattern SP2 may not be in contact with each other and may transmit and receive independent electrical signals.

According to some example embodiments, the second main pattern SP2 may have the same shape as the first main pattern SP1. For example, the second main pattern SP2 may have the lozenge shape, however, this is merely an example. The second main pattern SP2 may have various shapes, and it should not be limited to a particular embodiment.

The second adjacent pattern SP2H may be located adjacent to the hole area HA. The second adjacent pattern SP2H may have an area smaller than an area of the second main pattern SP2. The second adjacent pattern SP2H may have a shape obtained by removing an area overlapping with the hole area HA from the same lozenge shape as the second main pattern SP2.

According to some example embodiments, the second connection pattern CP2 may extend along the first direction DR1. The second connection pattern CP2 may be connected to the second main pattern SP2. The second connection pattern CP2 may be located between two second main patterns to connect the two second main patterns to each other. As another way, the second connection pattern CP2 may be located between the second main pattern SP2 and the second adjacent pattern SP2H to connect the second main pattern SP2 and the second adjacent pattern SP2H.

The sensing lines TL1, TL2, and TL3 may be located in the peripheral area NAA. The sensing lines TL1, TL2, and TL3 may include first sensing lines TL1, second sensing lines TL2, and third sensing lines TL3.

The first sensing lines TL1 may be respectively connected to the first sensing electrodes TE1. According to some example embodiments, the first sensing lines TL1 may be respectively connected to upper ends among both ends of the first sensing electrodes TE1.

The second sensing lines TL2 may be respectively connected to one ends of the second sensing electrodes TE2. According to some example embodiments, the second sensing lines TL2 may be respectively connected to left ends among both ends of the second sensing electrodes TE2.

The third sensing lines TL3 may be respectively connected to lower ends among both ends of the first sensing electrodes TE1. According to some example embodiments, the first sensing electrodes TE1 may be respectively connected to the first sensing lines TL1 and the third sensing lines TL3. Thus, the sensitivity with respect to an area of the first sensing electrodes TE1, which has a relatively longer length than that of the second sensing electrodes TE2, may be uniformly maintained. However, this is merely an example. The third sensing lines TL3 may be omitted in the sensing unit 220 according to some example embodiments of the present disclosure, and it should not be limited to a particular embodiment.

The sensing pads T1, T2, and T3 may be located in the peripheral area NAA. The sensing pads T1, T2, and T3 may include first sensing pads T1, second sensing pads T2, and third sensing pads T3. The first sensing pads T1 may be respectively connected to the first sensing lines TL1 to apply the external signal to the first sensing electrodes TE1. The second sensing pads T2 may be respectively connected to the second sensing lines TL2 and may be electrically connected to the second sensing electrodes TE2, and the third sensing pads T3 may be respectively connected to the third sensing lines TL3 and may be electrically connected to the second sensing electrodes TE2.

FIG. 4A shows a first sensing electrode TE1H passing through the hole area HA among the first sensing electrodes TE1 and a second sensing electrode TE2H passing through the hole area HA among the second sensing electrodes TE2. For example, FIG. 4A shows two first adjacent patterns SP11 and SP12, two first main patterns SP13 and SP14, and two first connection patterns CP11 and CP12 of the first sensing electrodes TE1H. In addition, FIG. 4A shows two second adjacent patterns SP21 and SP22, two second main patterns SP23 and SP24, and two second connection patterns CP21 and CP22 of the second sensing electrodes TE2H.

Each of the first adjacent patterns SP11 and SP12 may correspond to the first adjacent pattern SP1H shown in FIG. 3B, and each of the second adjacent patterns SP21 and SP22 may correspond to the second adjacent pattern SP2H shown in FIG. 3B. Each of the first main patterns SP13 and SP14 may correspond to the first main pattern SP1 shown in FIG. 3B, and each of the second main patterns SP23 and SP24 may correspond to the second main pattern SP2 shown in FIG. 3B. In addition, each of the first connection patterns CP11 and CP12 may correspond to the first connection pattern CP1 shown in FIG. 3B, and each of the second connection patterns CP21 and CP22 may correspond to the second connection pattern CP2 shown in FIG. 3B.

The first connection patterns CP11 and CP12 may be located on a different layer from the second connection patterns CP21 and CP22. According to some example embodiments, the first connection patterns CP11 and CP12 may be located on a different layer from the first adjacent patterns SP11 and SP12 and the first main patterns SP13 and SP14, and the second connection patterns CP21 and CP22 may be located on the same layer as the first adjacent patterns SP21 and SP22 and the second main patterns SP23 and SP24 and may have a single unitary form. However, this is merely an example, the first connection patterns CP11 and CP12 may be located on the same layer as the first adjacent patterns SP11 and SP12 and the first main patterns SP13 and SP14, and it should not be limited to a particular embodiment.

The first adjacent patterns SP11 and SP12 may be arranged to be spaced apart from each other with the hole area HA interposed therebetween. The first adjacent patterns SP21 and SP22 may be electrically connected to each other via a first connection line BL1. The first connection line BL1 may be located in the hole area HA, for example, in a first area A1. The first area A1 may be defined at a position spaced apart from a boundary between the hole area HA and the active area AA and spaced apart from the edge of the hole MH.

Referring to FIG. 4B, the first adjacent pattern SP11 may include a planar portion PP1 and a protruding portion PP2. The planar portion PP1 may not overlap with the hole area HA. The protruding portion PP2 may extend from the planar portion PP1 and may overlap with the hole area HA. The first connection line BL1 may be connected to the first adjacent pattern SP11 via the protruding portion PP2, however, this is merely an example. The first connection line BL1 may extend to the active area AA and may be connected to the planar portion PP1. In this case, the protruding portion PP2 may be omitted from the first adjacent pattern SP11. The first adjacent pattern SP11 and the first connection line BL1 may have various shapes as long as the first adjacent pattern SP11 and the first connection line BL1 are connected to each other, however, they should not be limited to a particular embodiment.

The second main patterns SP23 and SP24 may be arranged to be spaced apart from each other with the hole area HA interposed therebetween. The second main patterns SP23 and SP24 may be electrically connected to each other via a second connection line BL2. The first connection line BL1 may be located in the first area A1 and may be electrically insulated from the second connection line BL2.

The sensing unit 220 according to some example embodiments may further include conductive light blocking patterns BP_I and BP_O located in the hole area HA, particularly, in the light blocking area BA. The conductive light blocking patterns BP_I and BP_O may include a first light blocking pattern BP_I and a second light blocking pattern BP_O, which are spaced apart from each other.

The light blocking area BA may include the first area A1, a second area A2, and a third area A3. The first area A1 may be an area in which the first and second connection lines BL1 and BL2 are located. The second area A2 may be an area between the first area A1 and the hole MH. The third area A3 may be an area between the first area A1 and the active area AA.

The first light blocking pattern BP_I may be located in the second area A2 of the hole area HA. The first light blocking pattern BP_I may be spaced apart from the first and second connection lines BL1 and BL2 and may overlap with the second area A2 when viewed in a plan view.

The first light blocking pattern BP_I may have a ring shape spaced apart from the hole MH by a predetermined distance to surround the edge of the hole MH. The first light blocking pattern BP_I may overlap with the second area A2 as long as the first light blocking pattern BP_I is spaced apart from the first and second connection lines BL1 and BL2, however, it should not be limited thereto or thereby.

The first light blocking pattern BP_I may have a conductivity and may include a light blocking material. For example, the first light blocking pattern BP_I may include an opaque metal material. The first light blocking pattern BP_I may allow the second area A2 to be perceived as a black color.

The second light blocking pattern BP_O may be located in the third area A3 of the hole area HA. The second light blocking pattern BP_O may be spaced apart from the first and second connection lines BL1 and BL2 and may overlap with the third area A3 when viewed in a plan view. The second light blocking pattern BP_O may entirely overlap with the third area A3 as long as the second light blocking pattern BP_O is spaced apart from the first and second connection lines BL1 and BL2 and the first adjacent pattern SP11, particularly, the planar portion PP1, however, it should not be limited thereto or thereby.

The second light blocking pattern BP_O may have a conductivity and may include a light blocking material. For example, the second light blocking pattern BP_O may include an opaque metal material. The second light blocking pattern BP_O may allow the third area A3 to be perceived as a black color.

According to some example embodiments of the present disclosure, the electronic panel 200 (refer to FIG. 2) further includes the first and second light blocking patterns BP_I and BP_O located in the sensing unit 220, and thus the light blocking area BA that is perceived as the black color may be arranged along a periphery of the hole area HA, particularly, the hole MH. The first area A1 of the light blocking area BA may be blocked by the first and second connection lines BL1 and BL2, the second area A2 of the light blocking area BA may be blocked by the first light blocking pattern BP_I, and the third area A3 of the light blocking area BA may be blocked by the second light blocking pattern BP_O. Accordingly, the light blocking property of the hole area HA may be easily realized without adding a light blocking pattern, such as a black matrix, overlapping with the hole area HA in the configuration other than the electronic panel 200.

According to some example embodiments of the present disclosure, because the light blocking area BA is directly formed in the electronic panel 200, a process, for example, an alignment process between the configuration other than the electronic panel 200 and the hole area HA, may be omitted. In addition, the aesthetic design of the electronic panel 200 may be improved.

Figure 5A:
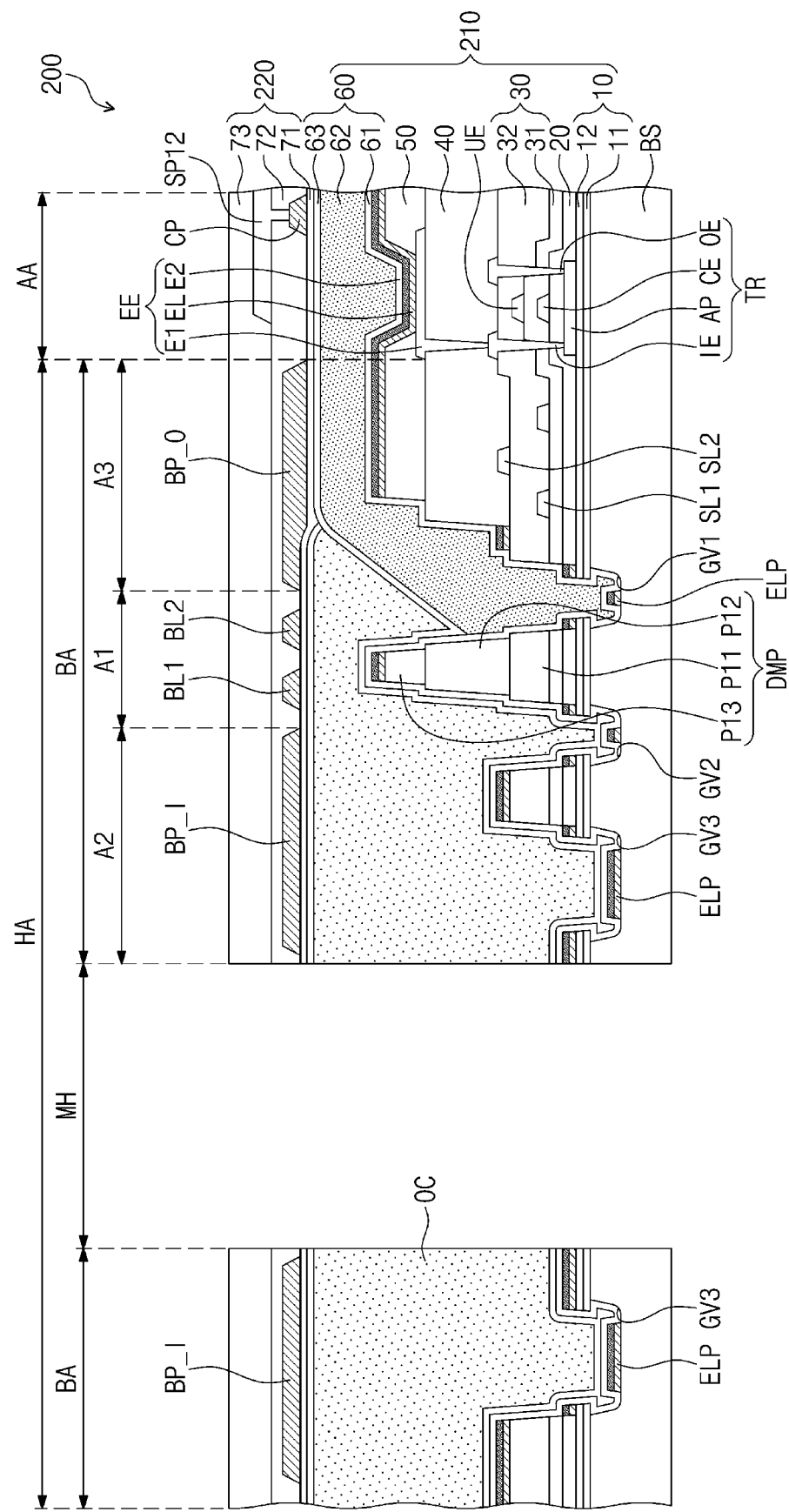
FIGS. 5A to 5C are cross-sectional views showing some areas of an electronic panel according to some example embodiments of the present disclosure.
Figure 5B:
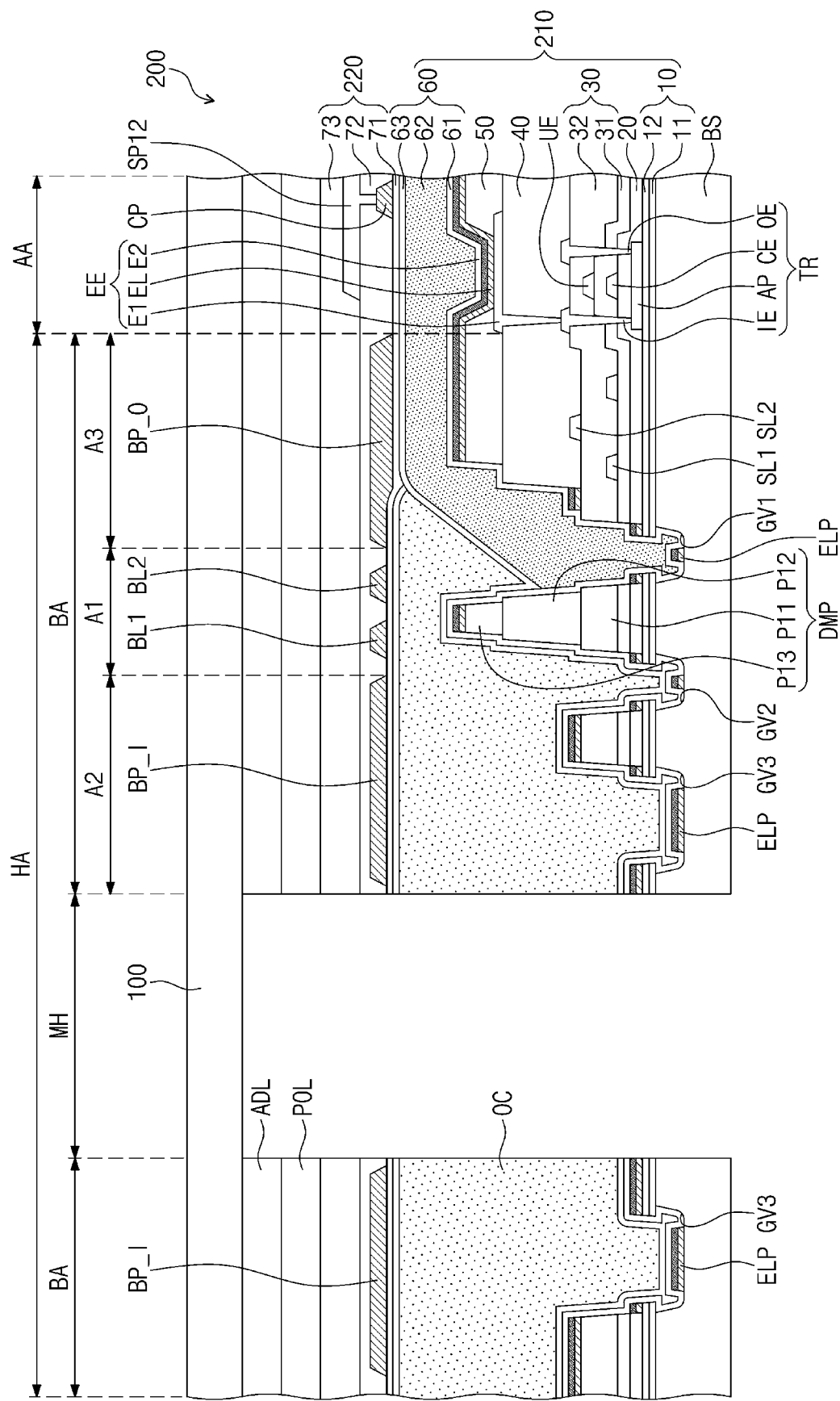
Figure 5C:
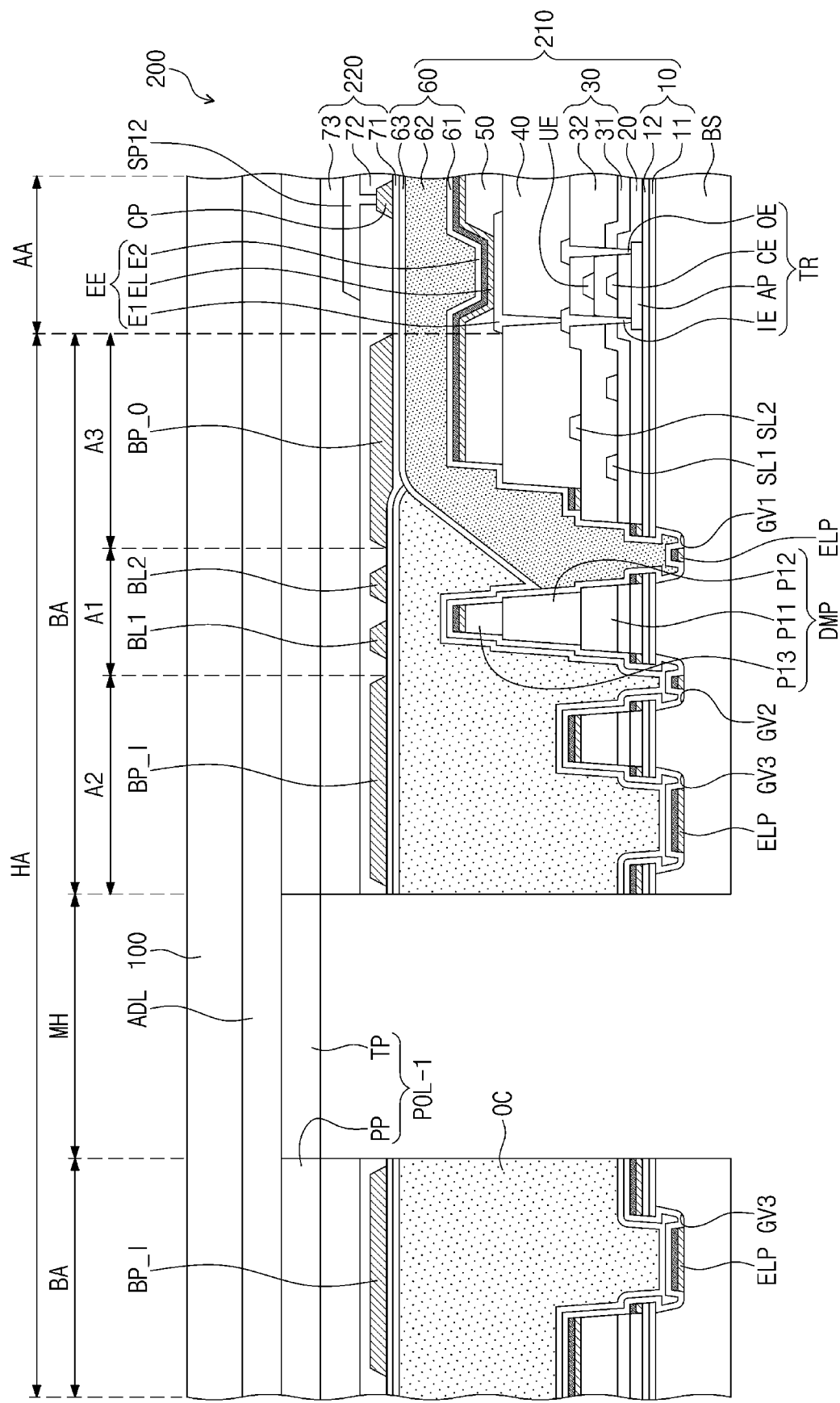

FIGS. 5A to 5C are cross-sectional views showing some areas of an electronic panel according to some example embodiments of the present disclosure. FIG. 5A shows a cross-section of the electronic panel, and FIGS. 5B and 5C show cross-sections in which some components of an electronic apparatus are omitted. For the convenience of explanation, FIGS. 5B and 5C show areas corresponding to FIG. 5A. Hereinafter, the present disclosure will be described with reference to FIGS. 5A to 5C. Meanwhile, in FIGS. 5A to 5C, the same reference numerals denote the same elements in FIGS. 1A to 4B, and thus some detailed descriptions of the same elements will be omitted.

Referring to FIGS. 5A to 5C, the display unit 210 and the sensing unit 220 of the electronic panel 200 may be stacked in the third direction DR3. The display unit 210 may include the base substrate BS, the pixel PX, a plurality of insulating layers 10, 20, 30, 40, and 50, and an encapsulation layer 60.

As described above, the base substrate BS may be an insulating substrate. For example, the base substrate BS may include the plastic substrate or the glass substrate.

According to some example embodiments, a thin film transistor TR corresponding to the second thin film transistor TR2 and the light emitting element EE among the components of the equivalent circuit diagram of the pixel PX shown in FIG. 3A are shown. The insulating layers 10, 20, 30, 40, and 50 may include first, second, third, fourth, and fifth insulating layers 10, 20, 30, 40, and 50, which are sequentially stacked. Meanwhile, each of the first, second, third, fourth, and fifth insulating layers 10, 20, 30, 40, and 50 may include an organic material and/or an inorganic material and may have a single-layer or multi-layer structure.

The first insulating layer 10 may be located on the base substrate BS to cover a front surface of the base substrate BS. The first insulating layer 10 may include a barrier layer 11 and/or a buffer layer 12. Therefore, the first insulating layer 10 may prevent or reduce oxygen or moisture flowing through the base substrate BS from entering the pixel PX or may lower a surface energy of the base substrate BS such that the pixel PX is stably formed on the base substrate BS.

Meanwhile, this is merely an example. At least one of the barrier layer 11 and the buffer layer 12 may be omitted from the electronic panel 200 according to some example embodiments of the present disclosure, and the electronic panel 200 may have a structure in which plural layers are stacked one on another, however, they should not be limited to a particular embodiment.

The thin film transistor TR may be located on the first insulating layer 10. The thin film transistor TR may include a semiconductor pattern AP, a control electrode CE, an input electrode IE, and an output electrode OE. The semiconductor pattern AP may be located on the first insulating layer 10. The semiconductor pattern AP may include a semiconductor material. The control electrode CE may be spaced apart from the semiconductor pattern AP with the second insulating layer 20 interposed therebetween. The control electrode CE may be connected to the first thin film transistor TR1 (refer to FIG. 3A) and one electrode of the capacitor CP (refer to FIG. 3A).

The input electrode IE and the output electrode OE may be located on the third insulating layer 30 and may be spaced apart from each other when viewed in a plan view. The input electrode IE and the output electrode OE may be respectively connected to one side and the other side of the semiconductor pattern AP after penetrating through the second insulating layer 20 and the third insulating layer 30.

Meanwhile, the display unit 210 according to some example embodiments of the present disclosure may further include an upper electrode UE. According to some example embodiments, the third insulating layer 30 may include a lower layer 31 and an upper layer 32, however, this is merely an example. The third insulating layer 30 according to some example embodiments of the present disclosure may have a single-layer structure, and it should not be limited thereto or thereby.

The upper electrode UE may be located between the lower layer 31 and the upper layer 32. The upper electrode UE may overlap with the control electrode CE when viewed in a plan view. According to some example embodiments, the upper electrode UE may receive the same electrical signal as the control electrode CE or may receive different electrical signals from the control electrode CE to serve as one electrode of the capacitor, however, this is merely an example. The upper electrode UE may be omitted from the electronic panel 200 according to some example embodiments of the present disclosure, and it should not be limited to a particular embodiment.

The fourth insulating layer 40 may be located on the third insulating layer 30 to cover the input electrode IE and the output electrode OE. In the thin film transistor TR, the semiconductor pattern AP may be located on the control electrode CE. As another way, the semiconductor pattern AP may be located on the input electrode IE and the output electrode OE. As another way, the input electrode IE and the output electrode OE may be located on the same layer as the semiconductor pattern AP and may be directly connected to the semiconductor pattern AP. The thin film transistor TR according to some example embodiments of the present disclosure may have various structures, and it should not be limited to a particular embodiment.

The light emitting element EE may be located on the fourth insulating layer 40. The light emitting element EE may include a first electrode E1, an organic layer EL, and a second electrode E2.

The first electrode E1 may be connected to the thin film transistor TR after penetrating through the fourth insulating layer 40. According to some example embodiments, the electronic panel 200 may further include a separate connection electrode located between the first electrode E1 and the thin film transistor TR, and in this case, the first electrode E1 may be electrically connected to the thin film transistor TR via the connection electrode.

The fifth insulating layer 50 may be located on the fourth insulating layer 40. The fifth insulating layer 50 may include an organic material and/or an inorganic material and may have a single-layer or multi-layer structure. The fifth insulating layer 50 may be provided with an opening defined therethrough. At least a portion of the first electrode E1 may be exposed through the opening. The fifth insulating layer 50 may be, but not limited to, a pixel definition layer.

The organic layer EL may be located between the first electrode E1 and the second electrode E2. The organic layer EL may include at least one light emitting layer. For example, the organic layer EL may include at least one material among materials respectively emitting red, green, and blue lights and may include a fluorescent material or a phosphorescent material. The organic layer EL may include an organic light emitting material or an inorganic light emitting material. The organic layer EL may emit the light in response to a difference in electric potential between the first electrode E1 and the second electrode E2.

According to some example embodiments, the organic layer EL is shown as a layer that has a single unitary form overlapping with a plurality of openings, however, this is merely an example. The organic layer EL may be provided as a plurality of patterns corresponding to the openings, respectively, and it should not be limited thereto or thereby.

Meanwhile, the organic layer EL may further include an electric charge control layer in addition to the light emitting layer. The electric charge control layer may control a movement of electric charges to improve a light emission efficiency and a lifespan of the light emitting element EE. In this case, the organic layer EL may include at least one of a hole transport material, a hole injection material, an electron transport material, and an electron injection material.

The second electrode E2 may be located on the organic layer EL. The second electrode E2 may face the first electrode E1. The second electrode E2 may extend from the active area AA to the peripheral area NAA and may have a single unitary form. The second electrode E2 may be commonly provided in the pixels. The light emitting element EE located in each of the pixels may receive a common power voltage (hereinafter, referred to as a "second power voltage") via the second electrode E2.

The second electrode E2 may include a transparent conductive material or a semi-transparent conductive material. Accordingly, the light generated by the organic layer 62 may easily travel to the third direction DR3 via the second electrode E2. However, this is merely an example. Depending on its design, the light emitting element EE according to some example embodiments of the present disclosure may be operated in a rear surface light emitting manner in which the first electrode E1 includes the transparent or semi-transparent material or a both surface light emitting manner in which the light is emitted to both of the front and rear surfaces, and it should not be limited to a specific embodiment.

The encapsulation layer 60 may be located on the light emitting element EE to encapsulate the light emitting element EE. According to some example embodiments, a capping layer may be further located between the second electrode E2 and the encapsulation layer 60 to cover the second electrode E2.

The encapsulation layer 60 may include a first inorganic layer 61, an organic layer 62, and a second inorganic layer 63, which are sequentially stacked in the third direction DR3, however, it should not be limited thereto or thereby. The encapsulation layer 60 may further include a plurality of inorganic layers and organic layers.

The first inorganic layer 61 may cover the second electrode E2. The first inorganic layer 61 may prevent or reduce external moisture or oxygen from entering the light emitting element EE. For example, the first inorganic layer 61 may include silicon nitride, silicon oxide, or a compound thereof. The first inorganic layer 61 may be formed by a chemical vapor deposition process.

The organic layer 62 may be located on the first inorganic layer 61 to make contact with the first inorganic layer 61. The organic layer 62 may provide a flat surface on the first inorganic layer 61. An uneven shape formed on the upper surface of the first inorganic layer 61 or particles existing on the first inorganic layer 61 may be covered by the organic layer 62, and thus an influence of a surface state of the upper surface of the first inorganic layer 61 on components formed on the organic layer 62 may be blocked. In addition, the organic layer 62 may relieve a stress between layers making contact with each other. The organic layer 62 may include an organic material and may be formed by a solution process, such as a spin coating, a slit coating, or an inkjet process.

The second inorganic layer 63 may be located on the organic layer 62 to cover the organic layer 62. The second inorganic layer 63 may be stably formed on a relatively flat surface rather than being located on the first inorganic layer 61. The second inorganic layer 63 may encapsulate moisture leaked from the organic layer 62 to prevent or reduce the moisture from flowing to the outside. The second inorganic layer 63 may include silicon nitride, silicon oxide, or a compound thereof. The second inorganic layer 63 may be formed by a chemical vapor deposition process. Meanwhile, each of the first inorganic layer 61, the organic layer 62, and the second inorganic layer 63 may include a plurality of layers, and it should not be limited to a particular embodiment.

Groove portions GV1, GV2, and GV3, a dam portion DMP, and signal lines SL1 and SL2 of the display unit may be located in an area overlapping with the light blocking area BA. The groove portions GV1, GV2, and GV3 may be defined to be spaced apart from each other. The groove portions GV1, GV2, and GV3 may include first, second, and third groove portions GV1, GV2, and GV3 sequentially formed in a direction far away from the active area AA and approaching the hole MH. Each of the first, second, and third groove portions GV1, GV2, and GV3 may have a closed line shape surrounding the hole MH or may have an intermittent line shape surrounding at least a portion of the edge of the hole MH, however, they should not be limited to a particular embodiment.

Each of the first, second, and third groove portions GV1, GV2, and GV3 may be defined by being recessed from the upper surface of the base substrate BS. Each of the first, second, and third groove portions GV1, GV2, and GV3 may be formed by removing at least a portion of the base substrate BS. A deposition pattern ELP may be located in each of the first, second, and third groove portions GV1, GV2, and GV3 and may be covered by at least one of the first inorganic layer 61 and the second inorganic layer 63.

The electronic panel 200 further includes the groove portions GV1, GV2, and GV3, and thus a continuity between the deposition pattern ELP and the light emitting element EE may be blocked. Accordingly, a penetration path of the external moisture or oxygen may be blocked, and thus the elements arranged in the active area AA may be prevented from being damaged.

In addition, because the deposition pattern ELP located in each of the first, second, and third groove portions GV1, GV2, and GV3 may be covered by the first inorganic layer 61 or the second inorganic layer 63, the deposition pattern ELP may be prevented from moving to another element and from exerting influence on another element when the electronic panel 200 is manufactured. Therefore, a process reliability of the electronic panel 200 may be improved. Meanwhile, this is merely an example, the groove portions GV1, GV2, and GV3 may be provided in a single unitary form or may be omitted from the electronic panel 200 according to some example embodiments of the present disclosure, and they should not be limited thereto or thereby.

The dam portion DMP may be located in a line area LA to restrict the area in which the organic layer 62 is formed into a predetermined area and to prevent the area in which the organic layer 62 is formed from expanding. The dam portion DMP may be provided in a plural number, and the dam portions DMP may be located between the groove portions GV1, GV2, and GV3. The dam portion DMP may have a stacking structure of first, second, and third layers P11, P12, and P13, however, this is merely an example. The dam portion DMP may have a single-layer structure, and it should not be limited thereto or thereby.

The electronic panel 200 according to some example embodiments of the present disclosure may further include an overcoating layer OC. The overcoating layer OC may include an organic material. The overcoating layer OC may be located in the hole area HA. The overcoating layer OC may cover an uneven surface defined in the hole area HA by the damp portion DMP and the groove portions GV1, GV2, and GV3 to provide a flat surface thereon. Thus, the flat surface may be stably provided in an area of the hole area HA, in which the organic layer 62 is not located.

The sensing unit 220 may include a plurality of conductive patterns and a plurality of sensing insulating layers 71, 72, and 73. For the convenience of explanation, FIGS. 5A to 5C show some portions SP, CP, BP_I, BP_O, BL1, and BL2 of the conductive patterns. In addition, the sensing insulating layers 71, 72, and 73 may include first, second, and third sensing insulating layers 71, 72, and 73 that are sequentially stacked in the third direction DR3.

The first sensing insulating layer 71 may cover the overcoating layer OC. According to some example embodiments, the first sensing insulating layer 71 may cover an upper surface of the overcoating layer OC in the hole area HA and may cover an upper surface of the second inorganic layer 63 in the active area AA. The conductive patterns SP, CP, BP_I, BP_O, BL1, and BL2 may be located on the first sensing insulating layer 71.

The second sensing insulating layer 72 and the third sensing insulating layer 73 may have a single unitary form overlapping with the hole area HA and the active area AA. The conductive patterns SP, CP, BP_I, BP_O, BL1, and BL2 may be covered by the third sensing insulating layer 73.

Each of the first, second, and third sensing insulating layers 71, 72, and 73 may include an inorganic layer and/or an organic layer. According to some example embodiments, each of the first, second, and third sensing insulating layers 71, 72, and 73 has a single-layer structure. However, according to embodiments, each of the first, second, and third sensing insulating layers 71, 72, and 73 may have a stacking structure of a plurality of layers making contact with each other, and it should not be limited thereto or thereby.

The conductive patterns SP, CP, BP_I, BP_O, BL1, and BL2 shown in FIGS. 5A to 5C may include a sensing pattern SP, a connection pattern CP, the first light blocking pattern BP_I, the second light blocking pattern BP_O, the first connection line BL1, and the second connection line BL2.

The sensing pattern SP may be located in the active area AA. According to some example embodiments, the sensing pattern SP may form one of the first main pattern SP1 (refer to FIG. 3B), the first adjacent pattern SP1H (refer to FIG. 3B), the second main pattern SP2 (refer to FIG. 3B), and the second adjacent pattern SP2H (refer to FIG. 3B).

The connection pattern CP may be located in the active area AA. The connection pattern CP may be located between the first sensing insulating layer 71 and the second sensing insulating layer 72. The connection pattern CP may be located on a different layer from the sensing pattern SP.

According to some example embodiments, the connection pattern CP may be one of the first connection pattern CP1 (refer to FIG. 3B) and the second connection pattern CP2 (refer to FIG. 3B) and may be located on a different layer from the sensing pattern SP.

According to some example embodiments, most of the first sensing electrodes TE1 (refer to FIG. 3B) and the second sensing electrodes TE2 (refer FIG. 3B) may be located between the second sensing insulating layer 72 and the third sensing insulating layer 73, and only one pattern of the first connection pattern CP1 and the second connection pattern CP2 may be located on a different layer from the other pattern to connect adjacent sensing patterns to each other. However, this is merely an example, and the first sensing electrode TE1 and the second sensing electrode TE2 may be located on different layers, however, they should not be limited to a particular embodiment.

The first and second light blocking patterns BP_I and BP_O may be located in the light blocking area BA. The first and second light blocking patterns BP_I and BP_O may be located between the first sensing insulating layer 71 and the second sensing insulating layer 72. The first and second light blocking patterns BP_I and BP_O may be located on the same layer as the first connection pattern CP1.

In addition, the first and second light blocking patterns BP_I and BP_O may be located on the same layer as the first and second connection lines BL1 and BL2 located in the first area A1. The first and second light blocking patterns BP_I and BP_O may be located to be spaced apart from the first and second connection lines BL1 and BL2, and thus the first and second light blocking patterns BP_I and BP_O may be electrically insulated from the first and second connection lines BL1 and BL2.

In FIGS. 5A to 5C, for the convenience of explanation, the first area A1 is defined at a position at which the overcoating layer OC overlaps with the organic layer 62 when viewed in a plan view. Accordingly, the first and second connection lines BL1 and BL2 may overlap with the overcoating layer OC and the organic layer 62 when viewed in a plan view.

However, this is merely an example, and the first area A1 may be defined at a position that is more adjacent to the active area AA or defined at a position that is further away from the active area AA. Therefore, the first and second connection lines BL1 and BL2 may be spaced apart from the overcoating layer OC to overlap only with the organic layer 62 or may be spaced apart from the organic layer 62 to overlap only with the overcoating layer OC, however, they should not be limited thereto or thereby.

As shown in FIG. 5B, the anti-reflective member POL may be located on the sensing unit 220. In this case, a portion of the anti-reflective member POL, which corresponds to the hole MH, may be removed. The adhesive member ADL may have a shape corresponding to the anti-reflective member POL. The window 100 may be located to overlap with the hole MH to prevent or reduce external contaminants entering the electronic panel 200 via the hole MH. According to some example embodiments of the present disclosure, because the portion of the anti-reflective member POL, which corresponds to the hole MH, is removed, a light transmittance of the hole MH may be improved.

As shown in FIG. 5C, an anti-reflective member POL-1 may include a polarizing portion PP and a transmitting portion TP. The polarizing portion PP may overlap with the active area AA and may correspond to the anti-reflective member POL shown in FIG. 5B.

The transmitting portion TP may be located in an area overlapping with the hole MH. The transmitting portion TP may have a lower polarization property and a higher transmittance than the polarizing portion PP. The transmitting portion TP may be formed of an insulating material having a high light transmittance or may be formed by discoloring an area overlapping with the hole MH from the anti-reflective member POL-1. According to some example embodiments of the present disclosure, because the anti-reflective member POL-1 further includes the transmitting portion TP, the adhesive member ADL may be prevented from being exposed in the hole area HA, and a delamination of the anti-reflective member POL-1 may be improved, thereby providing the electronic apparatus having improved reliability.

Figure 6A:
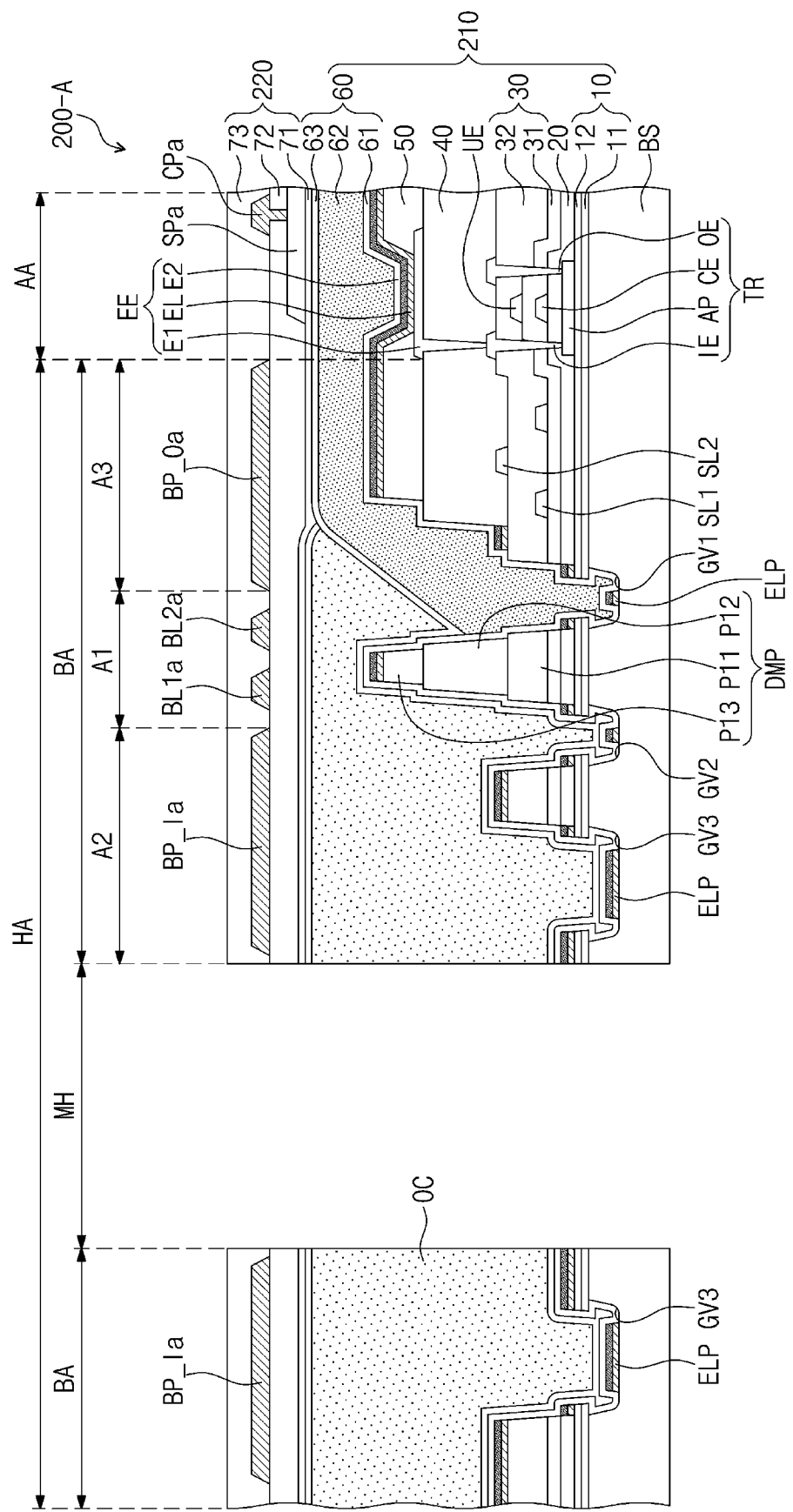
FIGS. 6A and 6B are cross-sectional views showing some areas of electronic panels according to some example embodiments of the present disclosure.
Figure 6B:
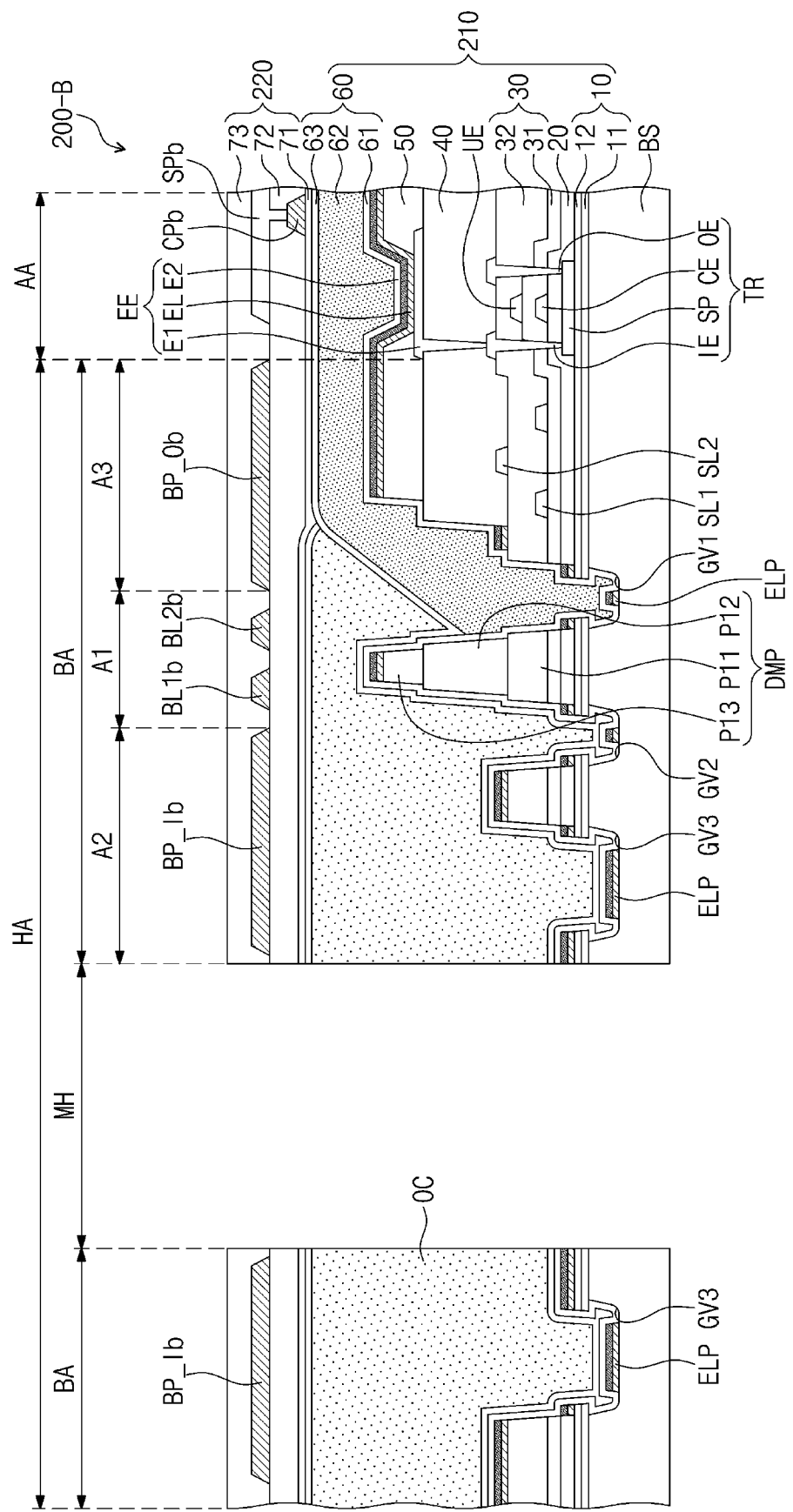

FIGS. 6A and 6B are cross-sectional views showing some areas of electronic panels 200-A and 200B according to some example embodiments of the present disclosure. FIGS. 6A and 6B show areas corresponding to FIG. 5A. Hereinafter, the present disclosure will be described with reference to FIGS. 6A and 6B.

Referring to FIG. 6A, in the electronic panel 200-A, a first connection pattern CPa, first and second connection lines BL1a and BL2a, and first and second light blocking patterns BP_Ia and BP_Oa may be located on a first sensing pattern SPa. The first connection pattern CPa, the first and second connection lines BL1a and BL2a, and the first and second light blocking patterns BP_Ia and BP_Oa may be located between a second sensing insulating layer 72 and a third sensing insulating layer 73. The first connection pattern CPa may be connected to the first sensing pattern SPa after penetrating through the second sensing insulating layer 72.

The first and second connection lines BL1a and BL2a and the first and second light blocking patterns BP_Ia and BP_Oa may be located on the same layer as the first connection pattern CPa. The first and second connection lines BL1a and BL2a may block a first area A1, and the first and second light blocking patterns BP_Ia and BP_Oa may respectively block a second area A2 and a third area A3.

Referring to FIG. 6B, in the electronic panel 200-B, first and second light blocking patterns BP_Ib and BP_Ob may be located on a different layer from a first connection pattern CPb. According to some example embodiments, the first connection pattern CPb may be located between a first sensing insulating layer 71 and a second sensing insulating layer 72, and the first and second light blocking patterns BP_Ib and BP_Ob may be located between the second sensing insulating layer 72 and a third sensing insulating layer 73.

The first and second light blocking patterns BP_Ib and BP_Ob may be located on the same layer as a first sensing pattern SPb. The first and second light blocking patterns BP_Ib and BP_Ob may be located to be spaced apart from the first sensing pattern SPb and may be electrically insulated from the first sensing pattern SPb.

The first and second light blocking patterns BP_Ib and BP_Ob may include a different material from that of the first sensing pattern SPb. For example, the first sensing pattern SPb may include a transparent conductive material, and the first and second light blocking patterns BP_Ib and BP_Ob may include an opaque conductive material. According to some example embodiments of the present disclosure, the first and second light blocking patterns BP_Ib and BP_Ob may be formed of a material different from that of the first sensing pattern SPb, and thus a light blocking property of the light blocking area BA may be stably maintained regardless of positions of the first and second light blocking patterns BP_Ib and BP_Ob on the cross section.

Figure 7A:
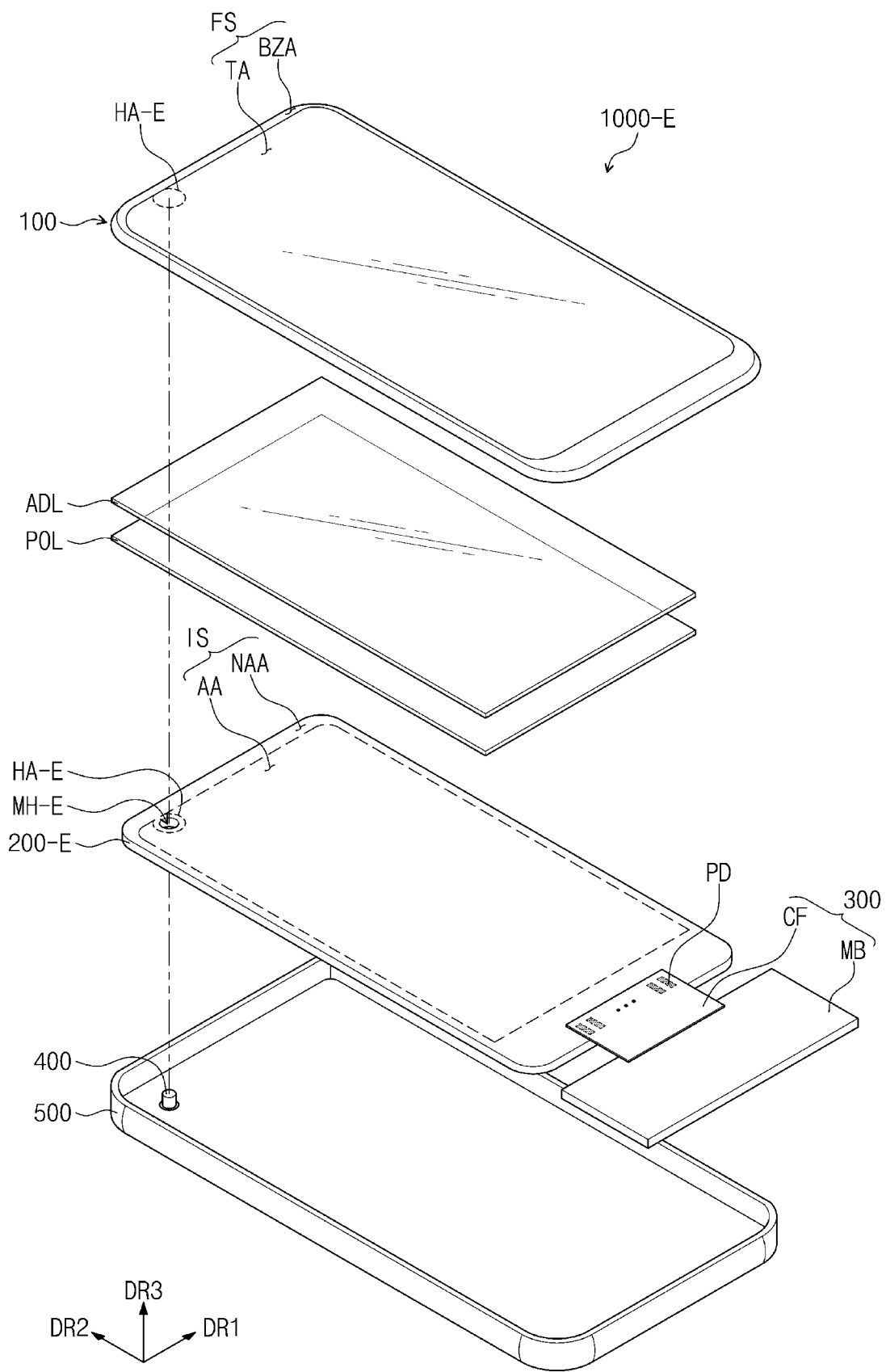
FIG. 7A is an exploded perspective view showing an electronic apparatus according to some example embodiments of the present disclosure.
Figure 7B:
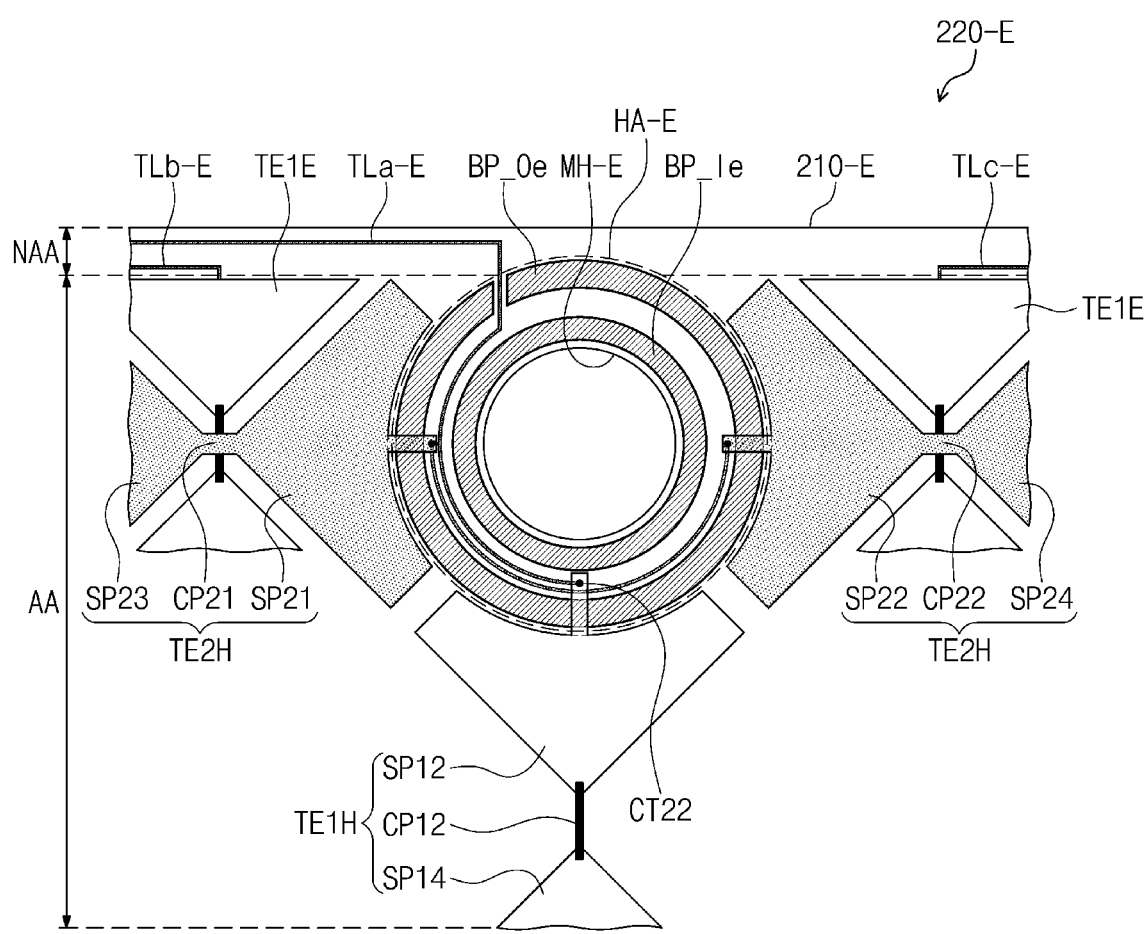
FIG. 7B is a plan view showing some areas of the electronic apparatus shown in FIG. 7A.
Figure 7C:
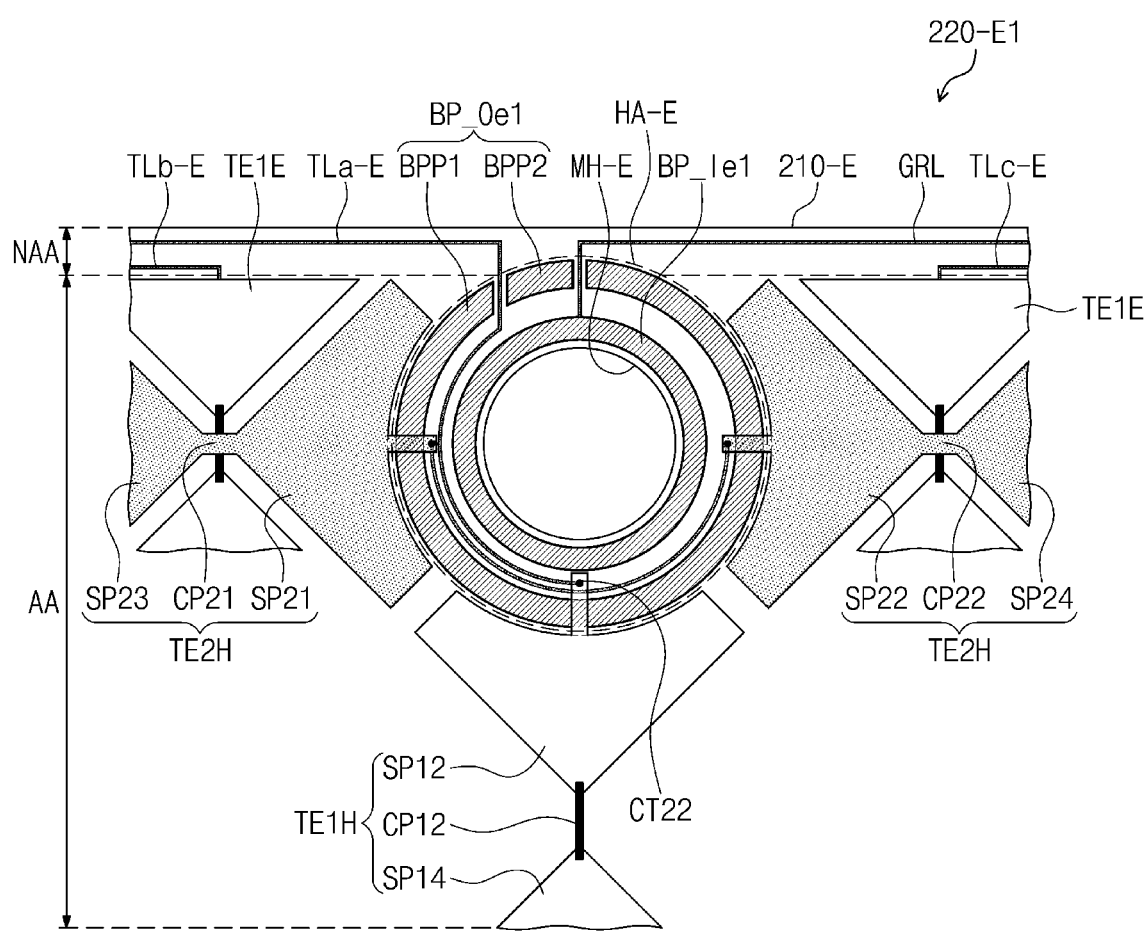
FIG. 7C is a plan view showing some areas of the electronic apparatus according to some example embodiments of the present disclosure.

FIG. 7A is an exploded perspective view showing an electronic apparatus 1000-E according to some example embodiments of the present disclosure. FIG. 7B is a plan view showing some areas of the electronic apparatus 1000-E shown in FIG. 7A. FIG. 7C is a plan view showing some areas of an electronic apparatus according to some example embodiments of the present disclosure. For the convenience of explanation, FIG. 7C shows areas corresponding to areas shown in FIG. 7B. Hereinafter, the present disclosure will be described with reference to FIGS. 7A to 7C. In FIGS. 7A to 7C, the same reference numerals denote the same elements in FIGS. 1A to 6B, and thus some detailed descriptions of the same elements will be omitted.

Referring to FIG. 7A, in the electronic apparatus 1000-E, a hole MH-E may be defined adjacent to a peripheral area NAA. Accordingly, an active area AA-E may be defined along an edge of the hole MH-E, and a hole area HA-E may be located to overlap with the peripheral area NAA in a front surface IS-E of an electronic panel 200-E. The hole area HA-E according to some example embodiments may make contact with or partially overlap with a bezel area BZA of a window 100.

FIGS. 7B and 7C schematically show a portion of a sensing unit 220-E in the area in which the hole MH-E is defined, and for the convenience of explanation, an edge of a display unit 210-E is shown. The portion of the sensing unit 220-E shown in FIGS. 7B and 7C may include a first sensing electrode TE1H passing through the hole MH-E and two first sensing electrodes TE1E spaced apart from each other with the hole MH-E interposed therebetween among first sensing electrodes. In addition, the portion of the sensing unit 220-E shown in FIGS. 7B and 7C may include a second sensing electrode TE2H passing through the hole MH-E among second sensing electrodes.

In addition, three sensing lines TLa-E, TLb-E, and TLc-E are shown in FIGS. 7B and 7C as a representative example. The sensing lines TLa-E, TLb-E, and TLc-E may be first sensing lines respectively connected to the first sensing electrodes. For example, the three sensing lines TLa-E, TLb-E, and TLc-E may be connected to the first sensing electrode TE1H passing through the hole MH-E, the first sensing electrode TE1E located on a left side of the hole MH-E, and the first sensing electrode TE1E located on a right side of the hole MH-E, respectively.

According to some example embodiments, light blocking patterns BP_Ie and BP_Oe may be located to be spaced apart from the sensing lines TLa-E, TLb-E, and TLc-E when viewed in a plan view. The light blocking patterns BP_Ie and BP_Oe may be electrically floated. A first light blocking pattern BP_Ie and a second light blocking pattern BP_Oe may not overlap with the sensing lines TLa-E, TLb-E, and TLc-E when viewed in a plan view. The second light blocking pattern BP_Oe may have an open curved line shape in which a portion, which overlaps with the sensing line TLa-E, of circular shape surrounding the hole MH-E is removed. According to some example embodiments of the present disclosure, because the light blocking patterns BP_Ie and BP_Oe and the sensing lines TLa-E, TLb-E, and TLc-E are designed not to overlap with each other in a plan view, the light blocking patterns BP_Ie and BP_Oe may reliably prevent an electrical interference between the sensing lines TLa-E, TLb-E and TLc-E.

As another way, referring to FIG. 7C, in a sensing unit 220-E1, at least one of light blocking patterns BP_Ie1 and BP_Oe1 may receive a ground voltage. According to some example embodiments, a first light blocking pattern BP_Ie1 may be connected to a predetermined ground line GRL to receive the ground voltage. A second light blocking pattern BP_Oe1 may be electrically floated. Thus, the second light blocking pattern BP_Oe1 may include a plurality of patterns BPP1 and BPP2 arranged to be spaced apart from sensing lines TLa-E, TLb-E, and TLc-E and the ground line GRL.

According to some example embodiments of the present disclosure, the light blocking patterns BP_Ie, BP_Oe, BP_Ie1, and BP_Oe1 may be electrically floated or may receive a predetermined voltage, such as the ground voltage. Accordingly, the electrical interference between the light blocking patterns BP_Ie, BP_Oe, BP_Ie1, and BP_Oe1 and the sensing electrodes or the sensing lines, which are adjacent to the light blocking patterns BP_Ie, BP_Oe, BP_Ie1, and BP_Oe, may be prevented. Therefore, the sensing units 220-E and 220-E1 may be stably operated, and the sensing unit 220-E1 may have improved electrical reliability.

Figure 8A:
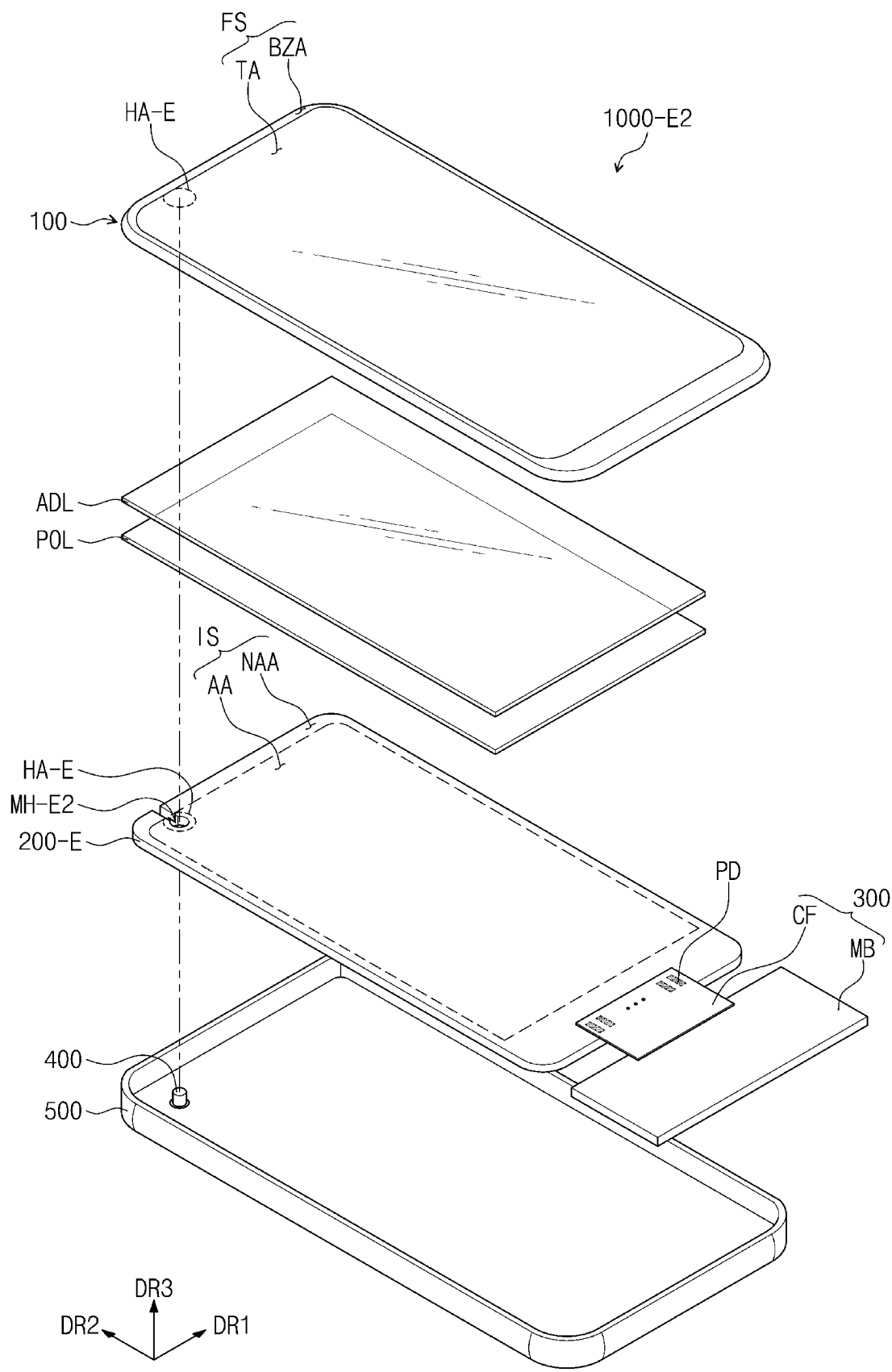
FIG. 8A is an exploded perspective view showing an electronic apparatus according to some example embodiments of the present disclosure.
Figure 8B:
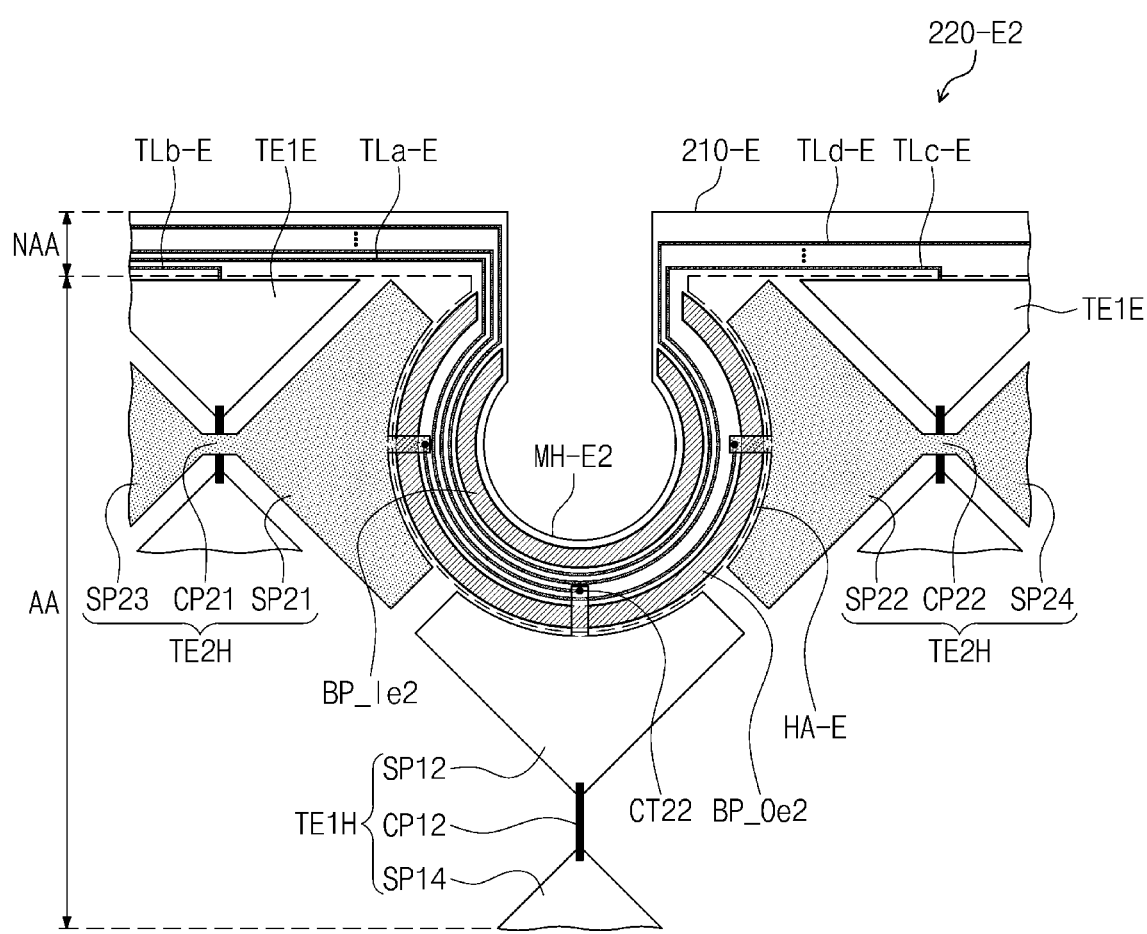
FIG. 8B is a plan view showing some areas of the electronic apparatus shown in FIG. 8A.
Figure 8C:
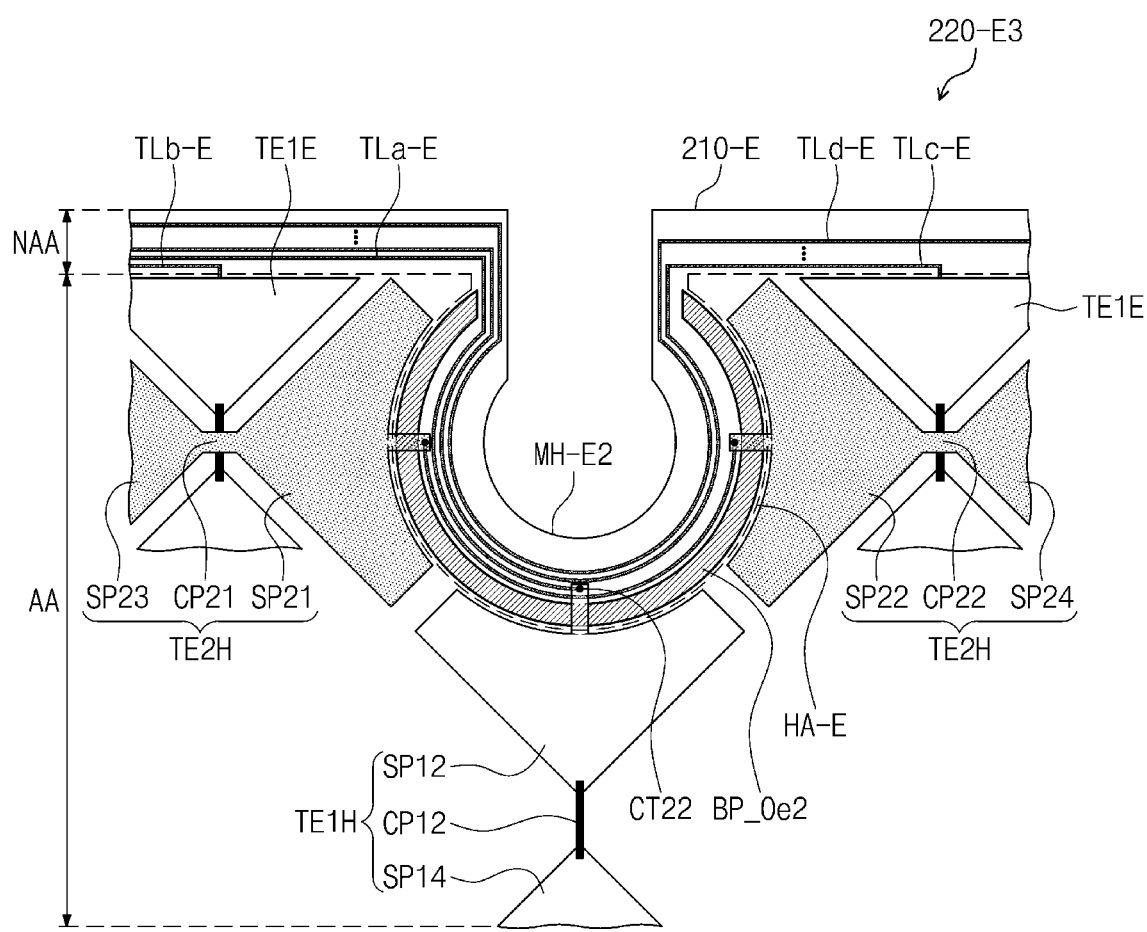
FIG. 8C is a plan view showing some areas of the electronic apparatus according to some example embodiments of the present disclosure.

FIG. 8A is an exploded perspective view showing an electronic apparatus 1000-E2 according to some example embodiments of the present disclosure. FIG. 8B is a plan view showing some areas of the electronic apparatus 1000-E2 shown in FIG. 8A. FIG. 8C is a plan view showing some areas of an electronic apparatus according to some example embodiments of the present disclosure. For the convenience of explanation, FIG. 8C shows areas corresponding to areas shown in FIG. 8B. Hereinafter, the present disclosure will be described with reference to FIGS. 8A to 8C. In FIGS. 8A to 8C, the same reference numerals denote the same elements in FIGS. 1A to 7C, and thus some detailed descriptions of the same elements will be omitted.

Referring to FIG. 8A, in the electronic apparatus 1000-E2, a hole MH-E2 may be defined through a portion of an active area AA and a portion of a peripheral area NAA. Accordingly, a portion of the hole MH-E2 according to some example embodiments of the present disclosure may overlap with a transmission area TA and the other portion of the hole MH-E2 according to some example embodiments of the present disclosure may overlap with a bezel area BZA.

FIG. 8B schematically shows a portion of a sensing unit 220-E2 in an area in which the hole MH-E2 is defined, and for the convenience of explanation, an edge of a display unit 210-E is shown. The portion of the sensing unit 220-E2 shown in FIG. 8B may be a portion of an area corresponding to the portion of the sensing unit 220-E shown in FIG. 7B.

According to some example embodiments, each of light blocking patterns BP_Ie2 and BP_Oe2 may have an open curved line shape obtained by removing a portion of a closed curved line shape. Each of the light blocking patterns BP_Ie2 and BP_Oe2 may have the open curved line shape obtained by removing a portion of a ring shape. Each of the light blocking patterns BP_Ie2 and BP_Oe2 may be electrically floated.

Among sensing lines TLa-E, TLb-E, TLc-E, and TLd-E of the sensing unit 220-E2, the sensing lines TLa-E and TLb-E located on a left side of the hole MH-E2 may correspond to those of FIG. 7B. Among sensing lines TLa-E, TLb-E, TLc-E, and TLd-E, the sensing lines TLc-E and TLd-E located on a right side of the hole MH-E2 may extend in the left side of the hole MH-E2 through a hole area HA-E. The sensing lines TLc-E and TLd-E located on the right side of the hole MH-E2 may be located between the light blocking patterns BP_Ie2 and BP_Oe2 and may transmit signals electrically independent from other conductive patterns adjacent thereto. According to some example embodiments of the present disclosure, some of the sensing lines TLa-E, TLb-E, TLc-E, and TLd-E of the sensing unit 220-E2 may extend through the hole area HA-E, and the light blocking patterns BP_Ie2 and BP_Oe2 may be located not to overlap with the sensing lines TLa-E, TLb-E, TLc-E, and TLd-E when viewed in a plan view, thereby uniformly blocking the hole area HA-E.

As shown in FIG. 8C, in a sensing unit 220-E3, a portion of light blocking patterns BP_Ie2 and BP_Oe2 may be omitted. According to some example embodiments, the first light blocking pattern BP_Ie2 may be omitted, and only the second light blocking pattern BP_Oe2 may exist. In this case, a hole area HA-E may be uniformly blocked by the second light blocking pattern BP_Oe2 and sensing lines TLa-E, TLc-E, and TLd-E. According to some example embodiments of the present disclosure, because a portion of the light blocking patterns BP_Ie2 and BP_Oe2 is removed within a predetermined area of the hole area HA-E, a density between conductive patterns may be reduced to prevent an electrical short circuit or electrical interference between the conductive patterns, and thus the electrical reliability of the sensing unit 220-E3 may be improved.

Figure 9A:
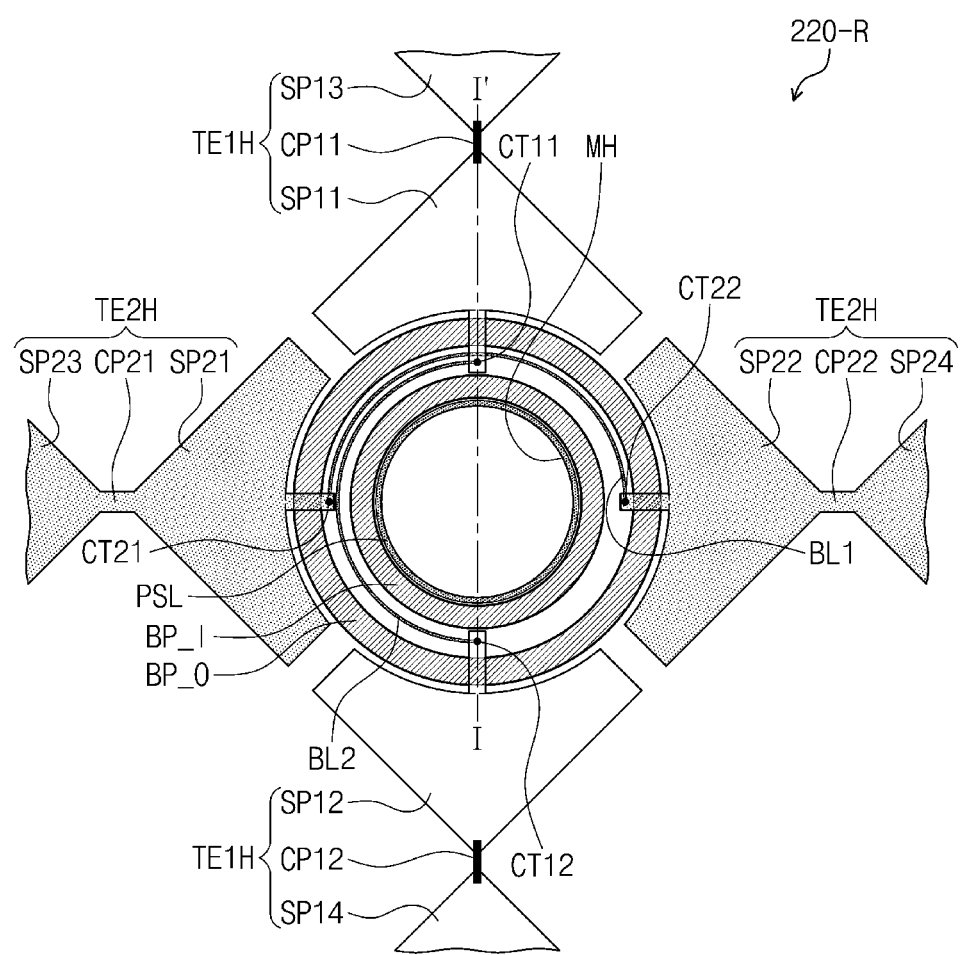
FIG. 9A is a plan view showing a portion of a sensing unit according to some example embodiments of the present disclosure.
Figure 9B:
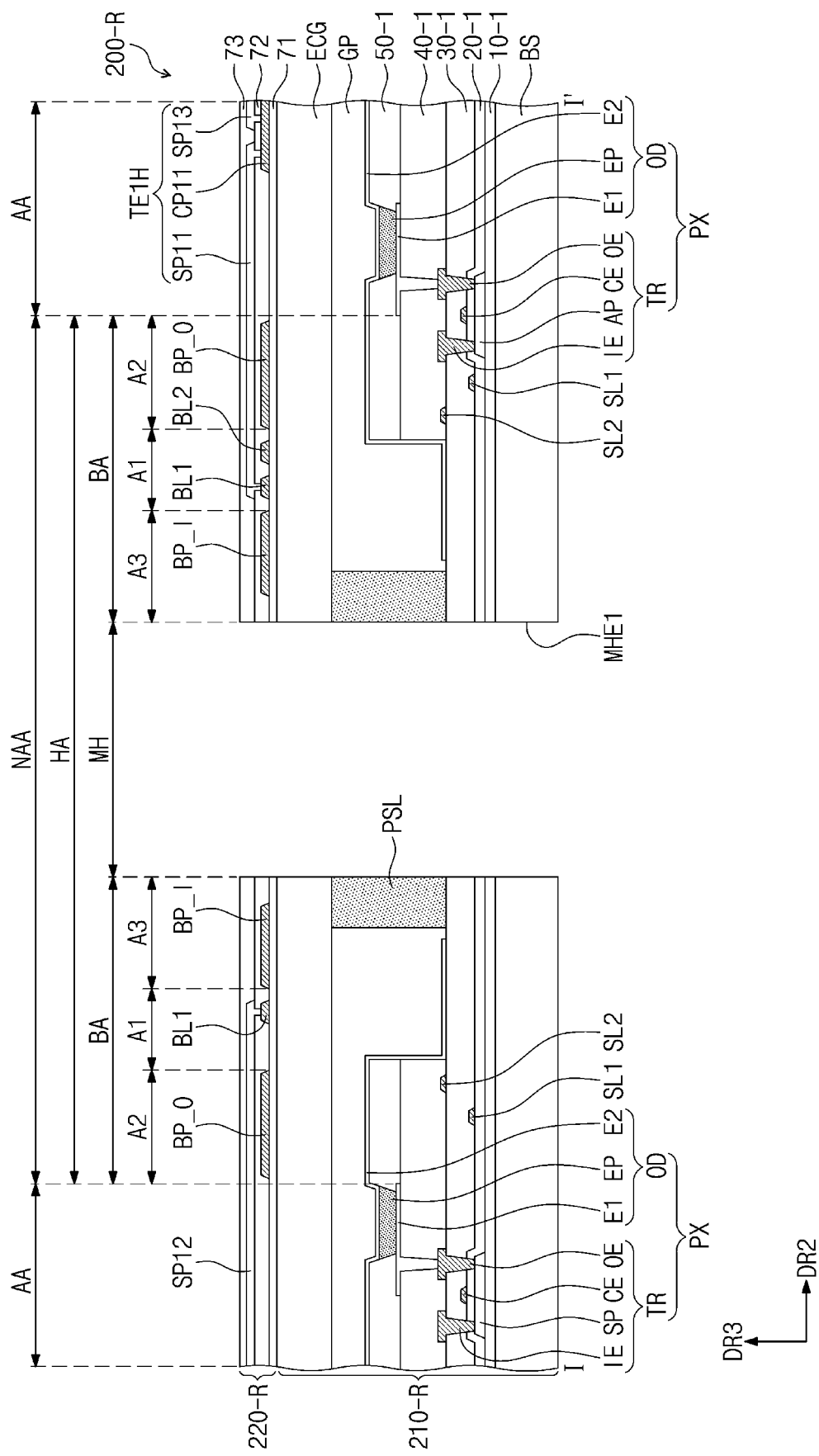
FIG. 9B is a cross-sectional view taken along a line I-I' shown in FIG. 9A.

FIG. 9A is a plan view showing a portion of a sensing unit according to some example embodiments of the present disclosure. FIG. 9B is a cross-sectional view taken along a line I-I' shown in FIG. 9A. Hereinafter, the present disclosure will be described with reference to FIGS. 9A and 9B. In FIGS. 9A and 9B, the same reference numerals denote the same elements in FIGS. 1A to 7C, and thus some detailed descriptions of the same elements will be omitted.

As shown in FIGS. 9A and 9B, an electronic panel 200-R may include a display unit 210-R and a sensing unit 220-R. The display unit 210-R may have a layer structure different from the display unit 210 shown in FIG. 5A. For example, the display unit 210-R may include a base substrate BS-1, a plurality of insulating layers 10-1, 20-1, 30-1, 40-1, and 50-1, an encapsulation substrate ECG, and a sealing member PSL.

The base substrate BS-1 may be an insulating substrate. The base substrate BS-1 may include a plastic substrate or a glass substrate.

The insulating layers 10-1, 20-1, 30-1, 40-1, and 50-1 may be sequentially stacked on the base substrate BS-1. The insulating layers 10-1, 20-1, 30-1, 40-1, and 50-1 may include first, second, third, fourth, and fifth insulating layers 10-1, 20-1, 30-1, 40-1, and 50-1.

The first insulating layer 10-1 may be located between the base substrate BS and a transistor TR. The transistor TR may include a semiconductor pattern AP, a control electrode CE, an input electrode IE, and an output electrode OE.

The second insulating layer 20-1 may be located between the semiconductor pattern AP and the control electrode CE, and the third insulating layer 30-1 may be located between the control electrode CE and the input electrode IE. Each of the input electrode IE and the output electrode OE may be connected to the semiconductor pattern AP after penetrating through the second insulating layer 20-1 and the third insulating layer 30-1.

The fourth insulating layer 40-1 may be located between a light emitting element OD and the transistor TR. The light emitting element OD may include a first electrode E1, a second electrode E2, and a light emitting pattern EP. The first electrode E1 may be connected to the transistor TR after penetrating through the fourth insulating layer 40-1.

The light emitting pattern EP may be located in an opening defined in the fifth insulating layer 50-1. The light emitting pattern EP may correspond to a light emitting layer, which includes a light emitting material, of the organic layer EL (refer to FIG. 5A). Meanwhile, for the convenience of explanation, FIG. 9B shows only one pixel PX, however, a plurality of pixels may be located on the cross section taken along the line I-I', and it should not be limited to a particular embodiment.

The encapsulation substrate ECG may be located on the fifth insulating layer 50-1. The encapsulation substrate ECG may be relatively rigid as compared with the encapsulation layer 60 shown in FIG. 5A. The encapsulation substrate ECG may be a substrate that has an insulating property and is optically transparent. For example, the encapsulation substrate ECG may include a glass substrate or a plastic substrate.

The encapsulation substrate ECG may be located to be spaced apart from the fifth insulating layer 50-1. The sealing member PSL may be located between the encapsulation substrate ECG and the base substrate BS. The sealing member PSL may couple the encapsulation substrate ECG and the base substrate BS such that the encapsulation substrate ECG and the base substrate BS are spaced apart from each other by a predetermined gap GP. The gap GP between the encapsulation substrate ECG and the base substrate BS may be filled with air or inert gas.

The sensing unit 220-R may be located on the display unit 210-R. As shown in FIG. 9B, a first adjacent pattern SP11 and a first main pattern SP13 may be connected to each other by a first connection pattern CP11 located on a different layer from the first adjacent pattern SP11 and the first main pattern SP13. A portion of the first adjacent pattern SP11 may extend in a light blocking area BA and may be connected to a first connection line BL1. This may correspond to the protruding portion PP2 (refer to FIG. 4B).

According to some example embodiments of the present disclosure, a first light blocking pattern BP_I and a second light blocking pattern BP_O may be located on the same layer as the first connection pattern C11 and may be located on a different layer from the first adjacent pattern SP11. Accordingly, although a portion of the first adjacent pattern SP11 extends in the light blocking area BA and overlaps with the first light blocking pattern BP_I or the second light blocking pattern BP_O, an electrical short circuit between the light blocking patterns BP_I and BP_O and a first sensing electrode TE1E may be prevented from occurring.

According to some example embodiments of the present disclosure, the sensing unit 220-R may be easily applied to the display unit 210-R including the rigid encapsulation substrate ECG. The sealing member PSL may overlap with the first light blocking pattern BP_I when viewed in a plan view. Therefore, the sealing member PSL may be prevented from being perceived in the hole area HA without adding a separate black matrix, and thus the aesthetic design of the electronic panel 200-R may be improved.

Figure 10:
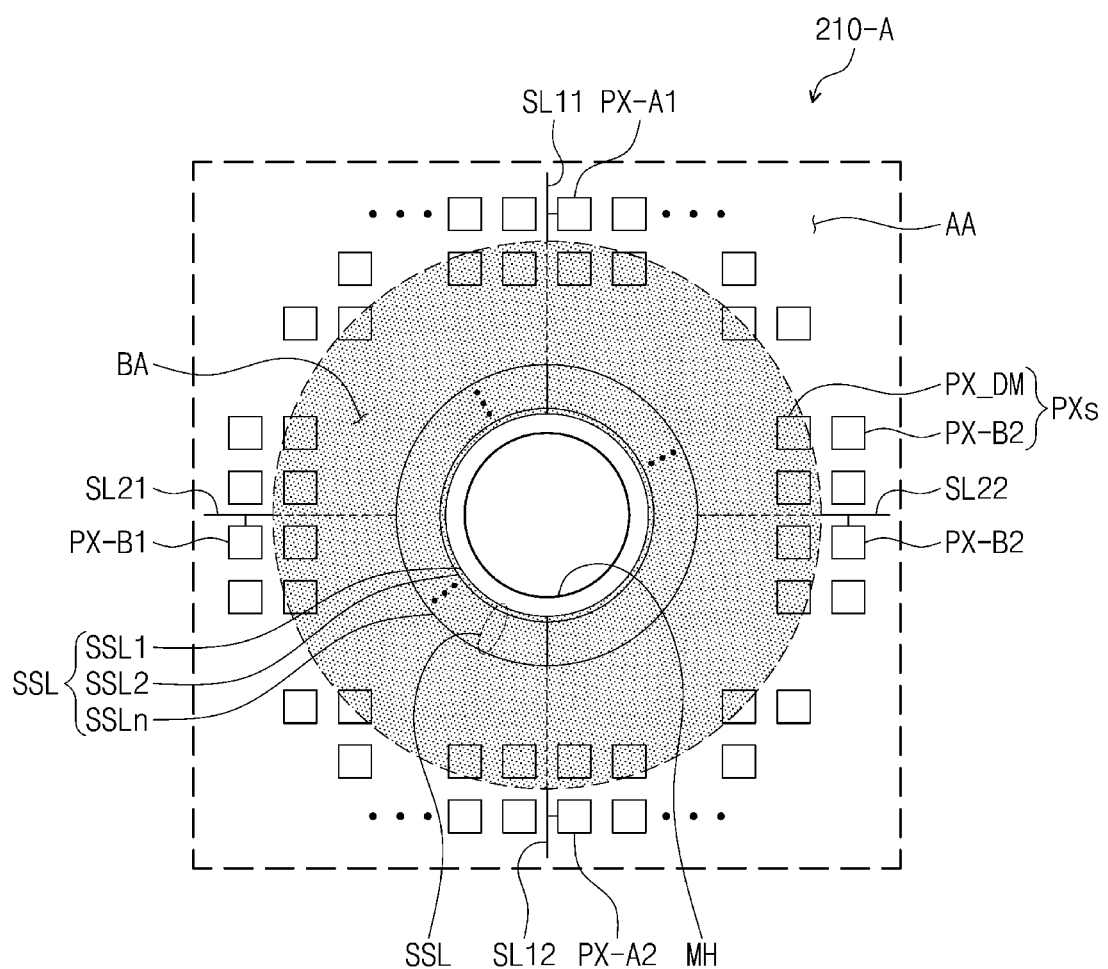
FIG. 10 is a plan view showing a portion of an electronic apparatus according to some example embodiments of the present disclosure.

FIG. 10 is a plan view showing a portion of an electronic apparatus according to some example embodiments of the present disclosure. For the convenience of explanation, FIG. 10 schematically shows a plan view of an area adjacent to a hole area HA of a display unit 210-A, and a light blocking area BA is shown by shading. Hereinafter, the present disclosure will be described with reference to FIG. 10. In FIG. 10, the same reference numerals denote the same elements in FIGS. 1A to 9B, and thus some detailed descriptions of the same elements will be omitted.

FIG. 10 shows a plurality of pixels PXs and a plurality of signal lines SL11, SL12, SL21, SL22, and SSL among components of the display unit 210-A as a representative example. The pixels PXs are shown in quadrangular shapes, and substantially, the pixels PXs may correspond to light emitting areas that emit lights by light emitting elements EE and OD.

The signal lines SL11, SL12, SL21, SL22, and SSL may include main signal lines SL11, SL12, SL21, and SL22 and sub-signal lines SSL. The main signal lines SL11, SL12, SL21, and SL22 may be arranged in an active area AA and may be connected to corresponding pixels among the pixels PXs. For the convenience of explanation, FIG. 10 shows a first main signal line SL11, a second main signal line SL12, a third main signal line SL21, and a fourth main signal line SL22.

The first main signal line SL11 may be a data line that provides a data signal to a first pixel PX-A1 among the pixels PXs, and the second main signal line SL12 may be a data line that provides a data signal to a second pixel PX-A2 among the pixels PXs. The third main signal line SL21 may be a gate line that provides a gate signal to a third pixel PX-B1 among the pixels PXs, and the fourth main signal line SL22 may be a gate line that provides a gate signal to a fourth pixel PX-B2 among the pixels PXs.

According to some example embodiments, the first pixel PX-A1 and the second pixel PX-A2 may be spaced apart from each other with a hole area HA interposed therebetween and may be arranged in the same column. The third pixel PX-B1 and the fourth pixel PX-B2 may be spaced apart from each other with the hole area HA interposed therebetween and may be arranged in the same row.

Meanwhile, according to some example embodiments, the main signal lines SL11, SL12, SL21, and SL22 may further include a light emission control line that transmits a light emission control signal to the pixels and an initialization voltage line that provides an initialization voltage to the pixels. The main signal lines may be implemented in various embodiments as long as they are respectively connected to the pixels PXs located in the active area AA to provide electrical signals controlling the pixels PXs, however, they should not be limited to a particular embodiment.

The sub-signal lines SSL may be located in the light blocking area BA. The sub-signal lines SSL may extend along an edge of the hole MH. Each of the sub-signal lines SSL may have a closed line shape surrounding the hole MH. According to some example embodiments, each of the sub-signal lines SSL may have a circular shape.

The sub-signal lines SSL may be located in the light blocking area BA to be spaced apart from each other. The sub-signal lines SSL may include at least one line among a line transmitting a gate signal, a line transmitting a data signal, a line transmitting an initialization voltage, a line transmitting a light emission control signal, and a line transmitting a power voltage.

The sub-signal lines SSL may include n lines sequentially arranged from the hole MH and spaced apart from each other. The n lines may transmit electrical signals applied to the pixels arranged in rows and columns occupied by the hole MH. The sub-signal lines SSL may be electrically connected to the main signal lines connected to the pixels located adjacent to the hole MH.

For the convenience of explanation, FIG. 10 shows a first sub-signal line SSL1 located closest to the hole MH, a second sub-signal line SSL2 surrounding the first sub-signal line SSL1, and an n-th sub-signal line SSLn located farthest from the hole MH as a representative example of the sub-signal lines SSL.

Each of the sub-signal lines SSL may be electrically connected to a corresponding main signal line among the main signal lines connected to the pixels. For example, the sub-signal lines SSL may be connected to the main signal lines connected to the pixels PXs to transmit the electrical signals to the pixels.

According to some example embodiments, connections between the main signal lines SL11, SL12, SL21, and SL22 and the sub-signal lines SSL are indicated by a dotted line. The first main signal line SL11 and the second main signal line SL12 may be connected to the first sub-signal line SSL1, and the third main signal line SL21 and the fourth main signal line SL22 may be connected to the n-th sub-signal line SSLn. Accordingly, the first main signal line SL11 and the second main signal line SL12 may transmit substantially the same electrical signal, and the third main signal line SL21 and the fourth main signal line SL22 may transmit substantially the same electrical signal.

According to some example embodiments, the main signal line and the sub-signal line, which are connected to each other, may be located on the same layer. In addition, the main signal line and the sub-signal line, which are connected to each other, may be integrally formed with each other.

According to some example embodiments of the present disclosure, because the first main signal line SL11 and the second main signal line SL12 are connected to each other by one first sub-signal line SSL1, the first and second pixels PX-A1 and PX-A2 spaced apart from each other with the hole MH interposed therebetween and forming the same column may receive a common electrical signal. Similarly, because the third main signal line SL21 and the fourth main signal line SL22 are connected to each other by one n-th sub-signal line SSLn, the third and fourth pixels PX-B1 and PX-B2 spaced apart from each other with the hole MH interposed therebetween and forming the same row may receive a common electrical signal. Therefore, the electrical signals may be stably applied to the pixels PX spaced apart from each other with the hole MH interposed therebetween without disconnecting the signal line.

According to some example embodiments of the present disclosure, the light blocking patterns BP_I and BP_O (refer to FIG. 4A) may be located in the light blocking area BA. Thus, the sub-signal lines SSL located in the display unit 210-A may be blocked by the light blocking patterns BP_I and BP_O so as not to be perceived from the outside, and the external light may be prevented from being reflected from the sub-signal lines SSL.

The pixels PXs may further include dummy pixels PX-DM overlapping with the light blocking area BA. At least some of the dummy pixels PX-DM may overlap with the second light blocking pattern BP_O (refer to FIG. 4A) when viewed in a plan view. The dummy pixels PX-DM may have substantially the same structure as the first, second, third, and fourth pixels PX-A1, PX-A2, PX-B1, and PX-B2.

A portion of the light emitting areas defined by the dummy pixels PX-DM may not be perceived from the outside by the light blocking area BA. The light blocking area BA may overlap with at least some of the dummy pixels PX-DM, and thus a boundary between the active area AA and the hole area HA may be perceived in the same manner as a shape of the edge of the light blocking area BA. Accordingly, the user may perceive an area, which has the shape similar to a designed shape, as the hole area HA, and thus the aesthetic design of the electronic panel may be improved.

Figure 11A:
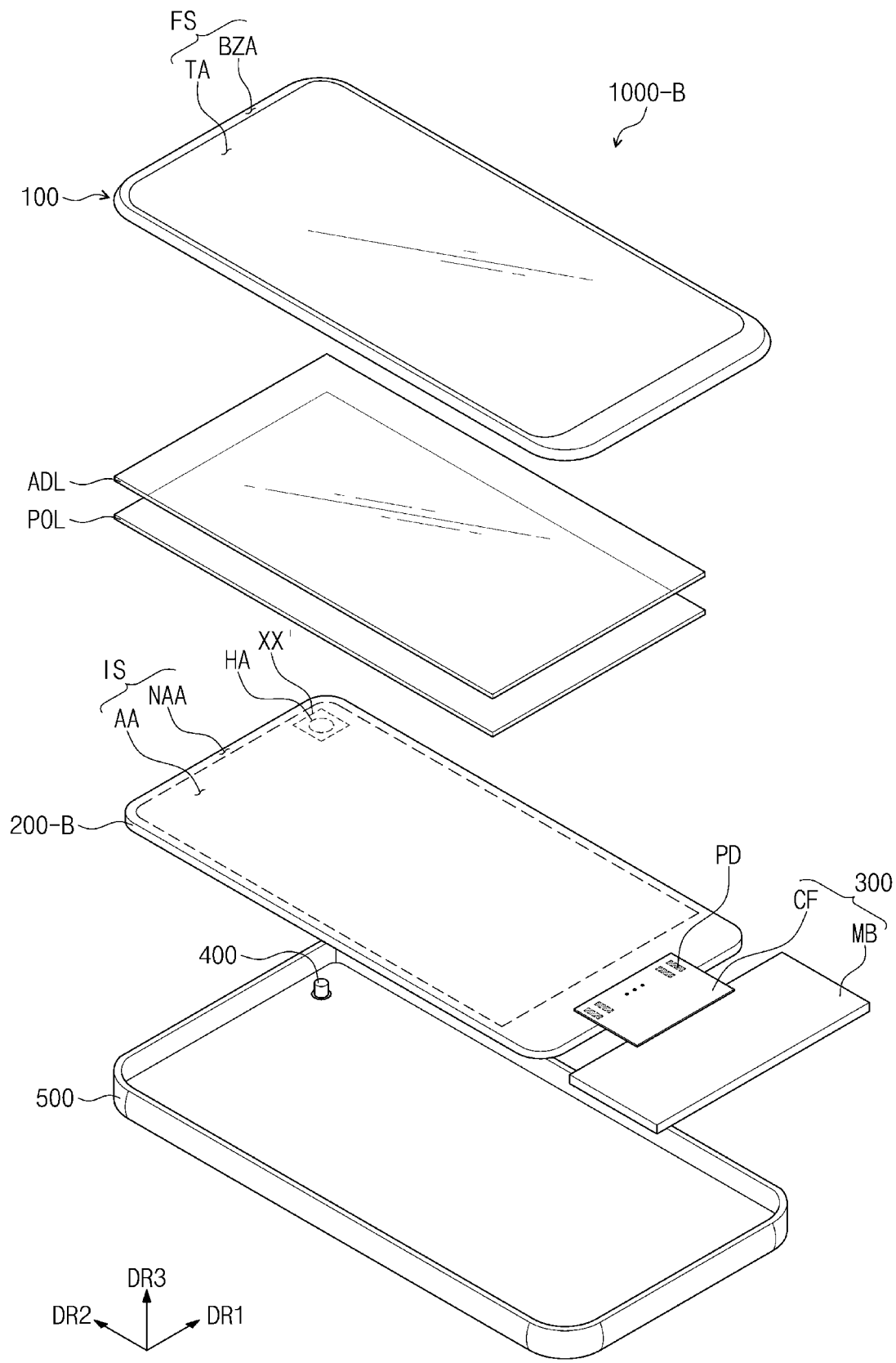
FIG. 11A is an exploded perspective view showing an electronic apparatus according to some example embodiments of the present disclosure.
Figure 11B:
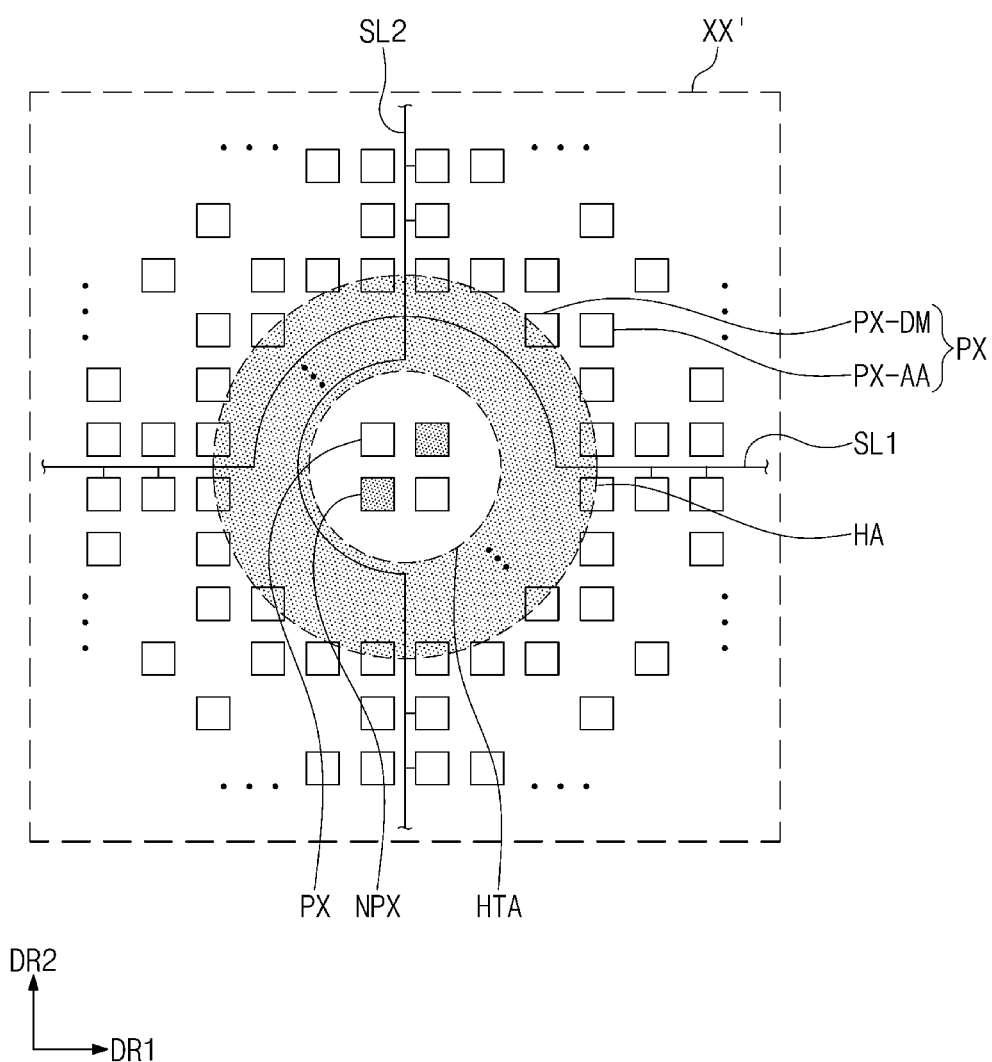
FIG. 11B is a plan view showing an area of XX' shown in FIG. 11A.
Figure 12A:
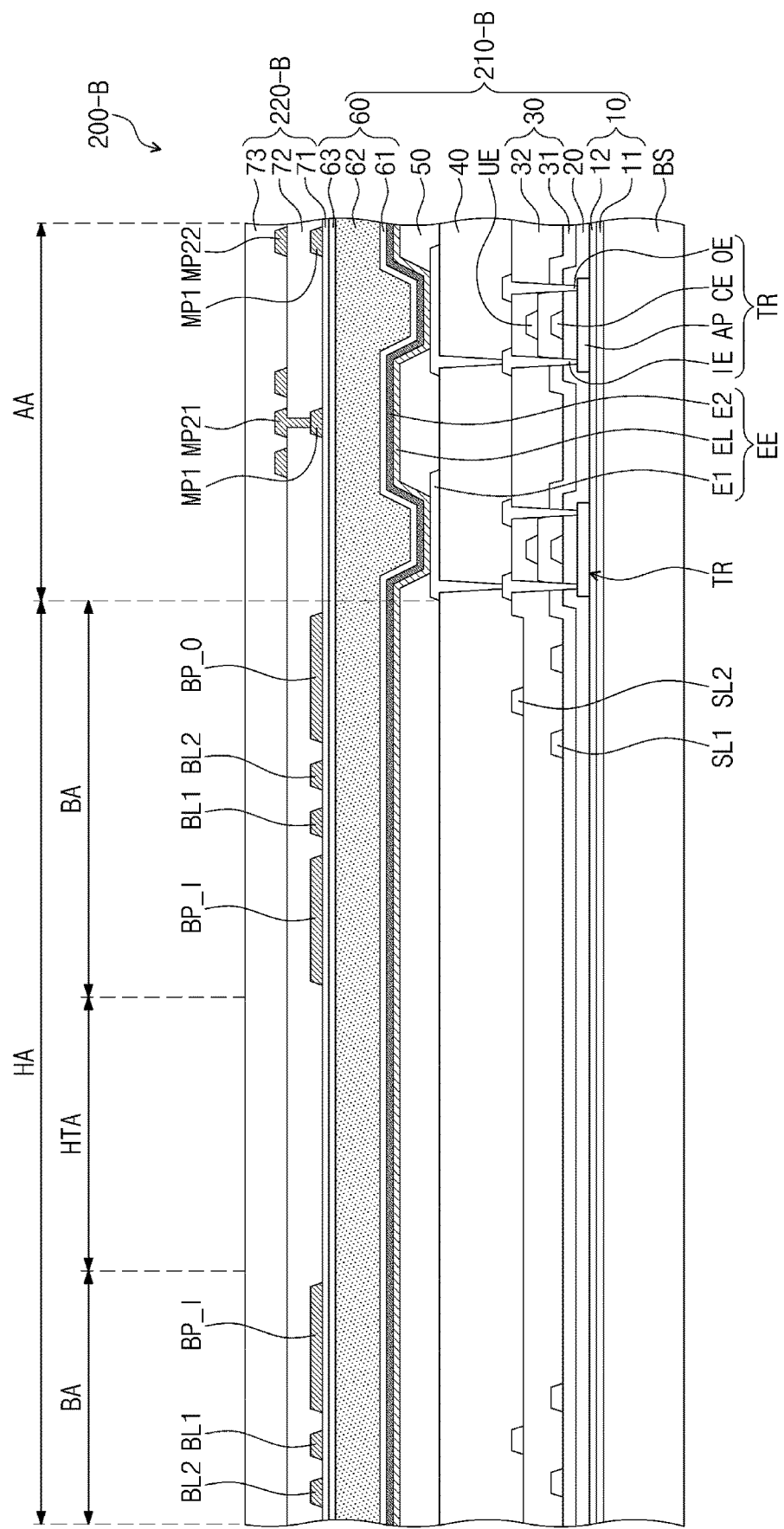
FIGS. 12A to 12C are cross-sectional views showing electronic panels according to some example embodiments of the present disclosure.
Figure 12B:
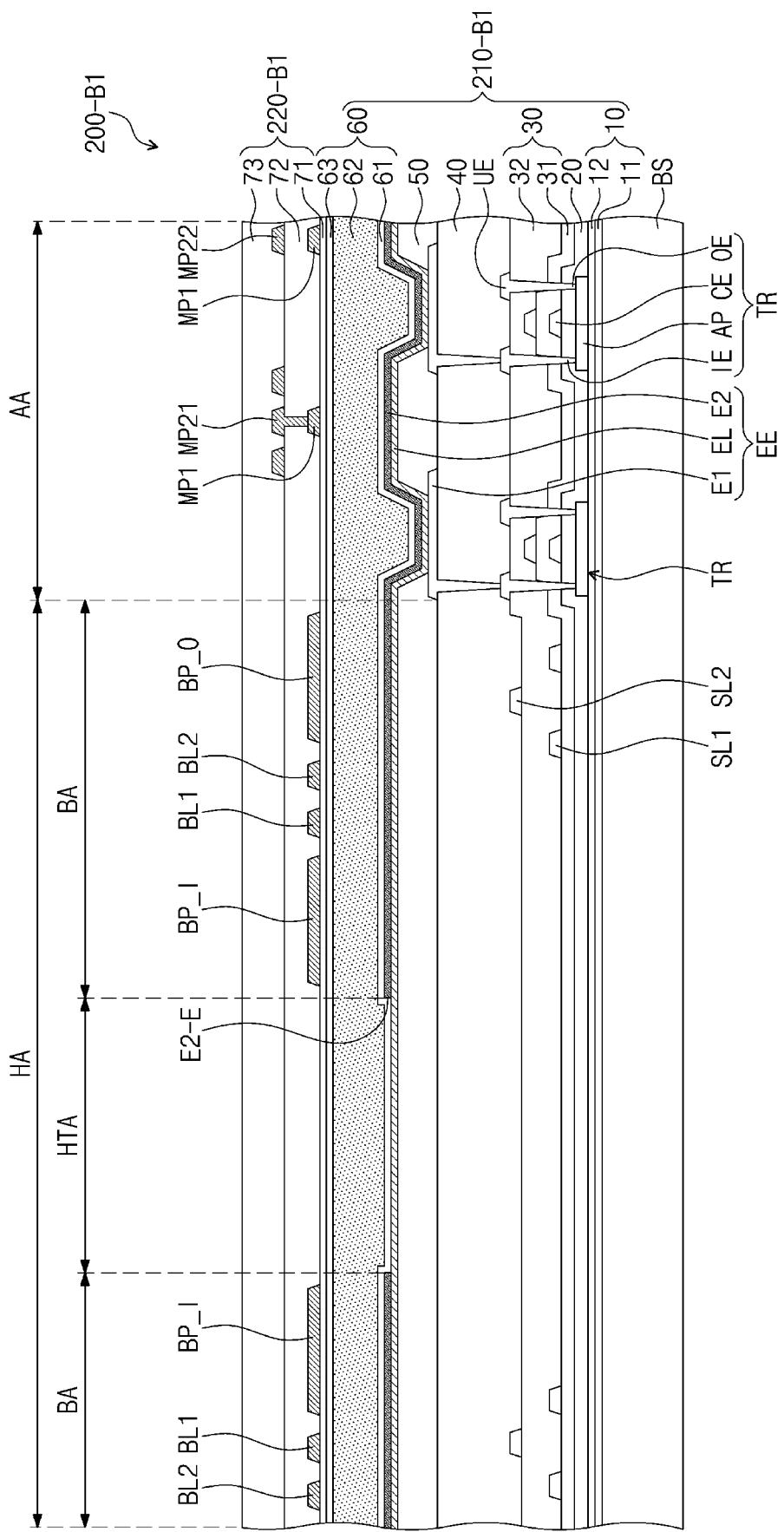
Figure 12C:
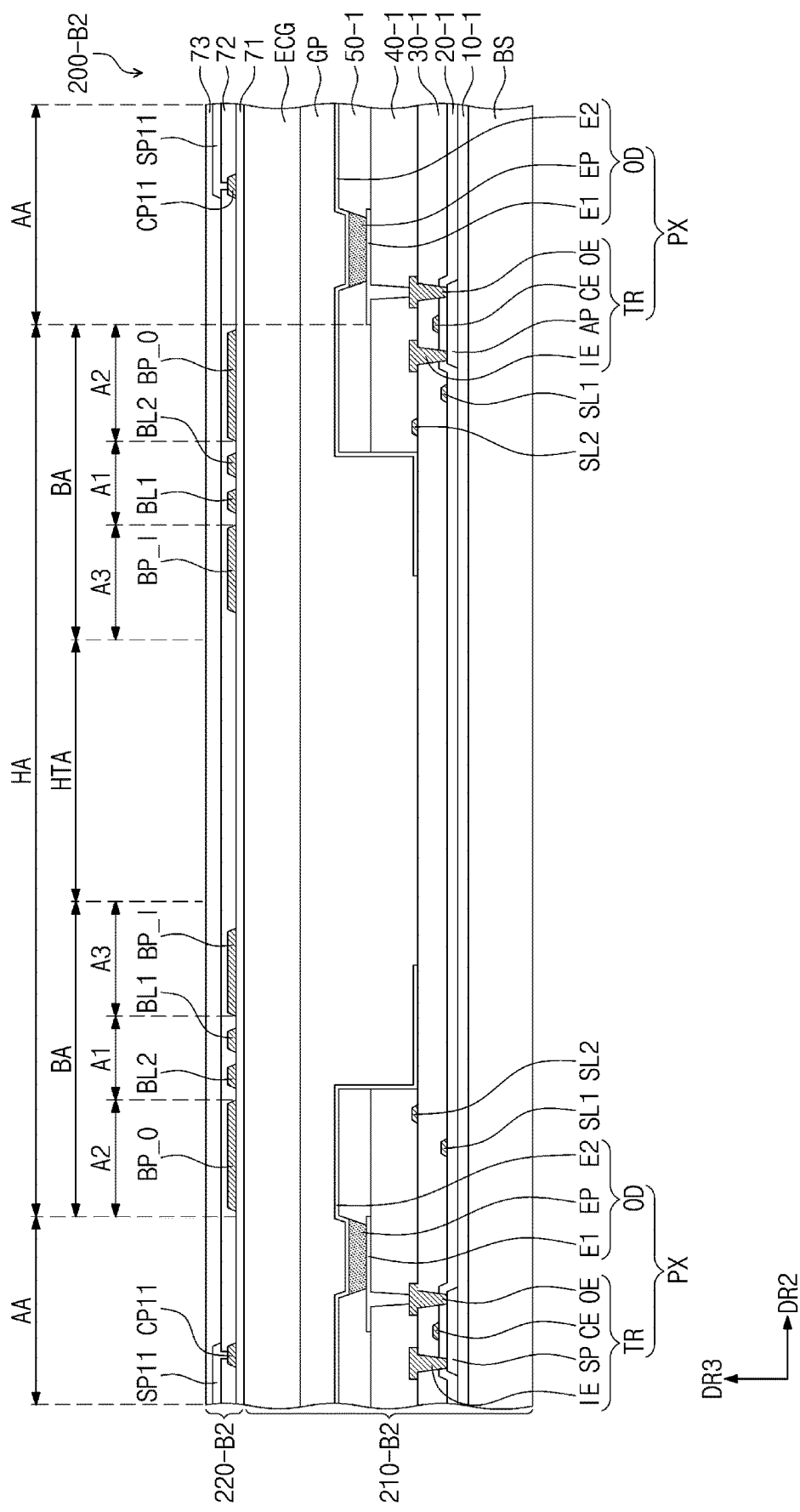

FIG. 11A is an exploded perspective view showing an electronic apparatus 1000-B according to some example embodiments of the present disclosure. FIG. 11B is a plan view showing an area of XX' shown in FIG. 11A. FIGS. 12A to 12C are cross-sectional views showing electronic panels according to some example embodiments of the present disclosure.

FIG. 11B shows an area corresponding to FIG. 10, and FIGS. 12A to 12C show areas corresponding to FIG. 5a. Hereinafter, the present disclosure will be described with reference to FIGS. 11A to 12C. In FIGS. 11A to 12C, the same reference numerals denote the same elements in FIGS. 1A to 10, and thus some detailed descriptions of the same elements will be omitted.

In the electronic apparatus 1000-B according to some example embodiments, an electronic panel 200-B may include a hole transmission area HTA corresponding to the hole MH (refer to FIG. 1B). For example, different from the electronic panel 200 shown in FIG. 1B, the hole MH may be omitted from the electronic panel 200-B.

The hole transmission area HTA may have a relatively higher transmittance than an area in which pixels PX are located in an active area AA. The electronic module 400 may sense an external subject through the hole transmission area HTA or may easily provide an optical signal that is output to the outside.

According to some example embodiments, the hole transmission area HTA may have a shape corresponding to the above-mentioned hole MH. For example, the hole transmission area HTA may have one of a circular shape, an elliptical shape, a polygonal shape, or a polygonal shape including at least one curved side, however, it should not be limited thereto or thereby.

At least one non-light emitting pixel NPX may be located in the hole transmission area HTA according to some example embodiments. For the convenience of explanation, FIG. 11B shows two non-light emitting pixels NPX and two pixels PX.

The pixel PX may be an area substantially emitting the light and may include a pixel PX-DM overlapping with a hole area HA and a pixel PX-AA located in the active area AA. Two signal lines SL1 and SL2 connected to the pixels PX are shown.

The non-light emitting pixel NPX may have a relatively high light transmittance as compared with the pixel PX. The non-light emitting pixel NPX may be formed by removing at least a portion of components of the pixels PX.

For example, the non-light emitting pixel NPX may be formed by removing a thin film transistor TR of the pixel PX. As another example, the non-light emitting pixel NPX may be formed by removing an organic pattern EP of the pixel PX, a portion of the thin film transistor TR, or only a first electrode E1. As another example, the non-light emitting pixel NPX may be formed by removing all components of the pixel PX. In this case, the non-light emitting pixel NPX may be defined as a portion at which a plurality of insulating layers is stacked.

The non-light emitting pixel NPX according to some example embodiments of the present disclosure may include various embodiments as long as the non-light emitting pixel NPX has the relatively high light transmittance as compared with the pixel PX. In addition, the hole transmission area HTA may include the plural pixels PX and one non-light emitting pixel NPX or may be filled with only a plurality of non-light emitting pixels NPX as long as the hole transmission area HTA has the relatively high light transmittance as compared with its periphery, however, it should not be limited thereto or thereby.

For example, as shown in FIG. 12A, the hole transmission area HTA may be defined by removing the thin film transistor TR and the first electrode E1 of the pixel PX of the display unit 210-B. The insulating layers may continuously extend in the hole transmission area HTA while being formed.

A base substrate BS, first, second, third, fourth, and fifth insulating layers 10, 20, 30, 40, and 50, an organic layer EL, an encapsulation layer 60, and sensing insulating layers 71, 72, and 73 may overlap with the hole transmission area HTA without being disconnected. The base substrate BS, the first, second, third, fourth, and fifth insulating layers 10, 20, 30, 40, and 50, the organic layer EL, the encapsulation layer 60, and the sensing insulating layers 71, 72, and 73 may be entirely formed in the active area AA via the hole transmission area HTA.

According to some example embodiments, the second electrode E2 may be formed to overlap with the hole transmission area HTA. In a case where the second electrode E2 is a transmission or semi-transmission type electrode, although the second electrode E2 overlaps with the hole transmission area HTA, the hole transmission area HTA may have a relatively high light transmittance as compared with the area in which the pixel PX is located.

A sensing unit 220-B according to some example embodiments may correspond to the embodiment in which the sensing unit 220 shown in FIG. 3B includes a plurality of mesh lines. For example, a first pattern MP1 located between the first sensing insulating layer 71 and the second sensing insulating layer 72 may correspond to the first connection pattern CP1 (refer to FIG. 3B), a second pattern MP21 located between the second sensing insulating layer 72 and the third sensing insulating layer 73 may correspond to the first sensing pattern SP1 (refer to FIG. 3B), and a third pattern MP22 located between the second sensing insulating layer 72 and the third sensing insulating layer 73 and insulated from the first pattern MP1 may correspond to the second sensing pattern SP2 (refer to FIG. 3B). According to some example embodiments of the present disclosure, as the sensing unit 220-B is formed by the mesh lines, the electronic panel 220-B may have improved bending properties.

Referring to FIG. 12B, in an electronic panel 200-B1 including a display unit 210-B1 and a sensing unit 220-B1, a second electrode E2 may be removed from a hole transmission area HTA. The second electrode E2 may include an end portion E2-E formed therein to define an opening overlapping with the hole transmission area HTA.

Accordingly, even though the second electrode E2 is formed as a non-transmission type electrode, the hole transmission area HTA may have improved transmittance. In addition, although the second electrode E2 is formed as a semi-transmission type electrode, the hole transmission area HTA may have a relatively high light transmittance as compared with the electronic panel shown in FIG. 12A.

Referring to FIG. 12C, an electronic panel 200-B2 may include a display unit 210-B2 including an encapsulation substrate ECG and a sensing unit 220-B2. The electronic panel 200-B2 may have a structure corresponding to a structure in which the hole MH (refer to FIG. 9B) is omitted from the electronic panel 200-R shown in FIG. 9B. In a hole transmission area HTA of the electronic panel 200-B2, a predetermined gap GP may exist between the encapsulation substrate ECG and a base substrate BS, and the sealing member PSL (refer to FIG. 9B) may be omitted.

According to some example embodiments of the present disclosure, the electronic module 400 may be stably located via the hole transmission area HTA, which is formed by removing opaque components, without physically forming the hole MH in the electronic panels 200-B, 200-B1, and 200-B2. According to some example embodiments of the present disclosure, the input/output of signals between the electronic module that does not require the high transmittance, for example, the electronic module using infrared lights or the electronic module using ultrasonic waves, and the outside may be easily performed. Even though the electronic module 400 is located to overlap with the electronic panels 200-B, 200-B1, and 200-B2, the input/output of signals between the electronic module and the outside may be reliably performed.

According to some example embodiments of the present disclosure, it is possible to prevent damages that may occur in the electronic panels during the process of forming the holes MH, so that the process reliability may be improved and the process may be simplified when the electronic panels 200-B, 200-B1 and 200-B2 are formed. In addition, because the upper portion of the electronic module 400 is covered by the electronic panels 200-B, 200-B1 and 200-B2, the electronic module 400 may be stably protected from external impacts or contaminant inflows.

Although some example embodiments of the present invention have been described, it is understood that the present invention should not be limited to these example embodiments but various changes and modifications can be made by one ordinary skilled in the art within the spirit and scope of the present invention as hereinafter claimed.

Therefore, the disclosed subject matter should not be limited to any single embodiment described herein, and the scope of the present inventive concept shall be determined according to the attached claims, and their equivalents.

What is claimed is:

1. An electronic apparatus comprising:
   an electronic panel comprising a display unit comprising a plurality of pixels and a sensing unit comprising a plurality of sensing electrodes; and
   an electronic module overlapping with the electronic panel when viewed in a plan view, the sensing unit comprising:
   a base substrate comprising a hole area overlapping with the electronic module, an active area overlapping with the sensing electrodes, and a peripheral area adjacent to the active area;
   a connection line in the hole area and connected to a portion of the sensing electrodes; and
   a conductive light blocking pattern in the hole area and comprising a plurality of light blocking patterns spaced apart from the connection line therebetween and spaced apart from the sensing electrodes.

2. The electronic apparatus of claim 1, wherein the hole area comprises:
   a hole transmission area overlapping with the electronic module;
   a first area spaced apart from the hole transmission area, the connection line located in the first area;
   a second area between the first area and the hole transmission area; and
   a third area between the first area and the active area, the conductive light blocking pattern comprises a first light blocking pattern in the second area and a second light blocking pattern in the third area, and each of the first light blocking pattern and the second light blocking pattern is spaced apart from the connection line in the plan view.

3. The electronic apparatus of claim 2, wherein the first light blocking pattern has a closed line shape that surrounds the hole transmission area.

4. The electronic apparatus of claim 2, wherein the second light blocking pattern overlaps with at least a portion of the pixels in the plan view.

5. The electronic apparatus of claim 1, wherein the sensing electrodes comprise:
   a first sensing electrode comprising a plurality of first sensing patterns and a plurality of first connection patterns each being located between the first sensing patterns to connect the first sensing patterns adjacent to each other; and
   a second sensing electrode comprising a plurality of second connection patterns spaced apart from the first connection patterns with a sensing insulating layer interposed therebetween and a plurality of second sensing patterns spaced apart from the first sensing patterns and connected to the second connection patterns, and the conductive light blocking pattern is located on a same layer as one of the first connection patterns and the second connection patterns.

6. The electronic apparatus of claim 5, wherein the conductive light blocking pattern is on a different layer from the first sensing patterns and overlaps with at least one of the first sensing patterns and the second sensing patterns.

7. The electronic apparatus of claim 6, wherein a portion of the first sensing patterns is connected to the connection line, and the portion overlaps with the conductive light blocking pattern in the plan view.

8. The electronic apparatus of claim 5, wherein the conductive light blocking pattern is on a same layer as the first sensing patterns and is spaced apart from the first sensing patterns and the second sensing patterns in the plan view.

9. The electronic apparatus of claim 8, wherein the conductive light blocking pattern comprises a material different from the first sensing patterns.

10. The electronic apparatus of claim 2, wherein the electronic panel comprises a hole penetrating through the hole transmission area.

11. The electronic apparatus of claim 1, wherein the conductive light blocking pattern comprises a floating pattern.

12. The electronic apparatus of claim 1, wherein the sensing unit receives a ground voltage.

13. An electronic apparatus comprising:
- a display unit comprising a base substrate comprising a hole transmission area, a light blocking area adjacent to the hole transmission area, and an active area adjacent to the light blocking area and a plurality of light emitting elements on the base substrate and located in the active area;
- a sensing unit comprising a plurality of sensing electrodes on the display unit and located in the active area, a connection line in the light blocking area and connected to a portion of the sensing electrodes, and a conductive light blocking pattern in the light blocking area and on a same layer as at least a portion of the sensing electrodes;
- a window on the sensing unit; and
- an anti-reflective member between the window and the sensing unit, the conductive light blocking pattern comprising:
- a first light blocking pattern between the hole transmission area and the connection line; and
- a second light blocking pattern spaced apart from the first light blocking pattern and located between the connection line and the active area.

14. The electronic apparatus of claim 13, wherein an opening is defined in the display unit to overlap with the hole transmission area and to penetrate through the anti-reflective member.

15. The electronic apparatus of claim 13, wherein the anti-reflective member comprises:
- a polarizing portion overlapping with the active area; and
- a transmitting portion overlapping with the hole transmission area and having a transmittance higher than the polarizing portion.

16. The electronic apparatus of claim 13, wherein the display unit further comprises light emitting elements that overlap with at least a portion of the conductive light blocking pattern.

17. The electronic apparatus of claim 13, wherein the sensing electrodes comprise:
- a first sensing electrode comprising a first connection pattern and a first sensing pattern on a different layer from the first connection pattern and connected to the first connection pattern; and
- a second sensing electrode comprising a second connection pattern on a same layer as the first sensing pattern and a second sensing pattern on a same layer as the second connection pattern and connected to the second connection pattern, and the first and second light blocking patterns are on a same layer as one of the first connection pattern and the second connection pattern.

18. The electronic apparatus of claim 13, wherein the display unit and the sensing unit are provided with a hole defined therethrough, and the window covers the hole.

19. The electronic apparatus of claim 18, wherein the display unit further comprises a sealing member that surrounds the hole, and the first light blocking pattern overlaps with the sealing member when viewed in a plan view.

20. The electronic apparatus of claim 13, wherein each of the first light blocking pattern and the second light blocking pattern is electrically floated or receives a ground voltage.

* * * * *